(12) United States Patent
Laird et al.

(10) Patent No.: US 8,715,606 B2
(45) Date of Patent: May 6, 2014

(54) ORGANIC PHOTOVOLTAIC DEVICES COMPRISING FULLERENES AND DERIVATIVES THEREOF AND IMPROVED METHODS OF MAKING FULLERENE DERIVATIVES

(75) Inventors: Darin W. Laird, Pittsburgh, PA (US); Henning Richter, Newton, MA (US); Viktor Vejins, Concord, MA (US); Larry Scott, Newton, MA (US); Thomas A. Lada, II, Brighton, MA (US)

(73) Assignees: Plextronics, Inc., Pittsburgh, PA (US); Nano-C, Inc., Westwood, MA (US)

( * ) Notice: Subject to any disclaimer, the term of this patent is extended or adjusted under 35 U.S.C. 154(b) by 1146 days.

(21) Appl. No.: 12/340,587

(22) Filed: Dec. 19, 2008

(65) Prior Publication Data

US 2009/0176994 A1 Jul. 9, 2009

Related U.S. Application Data

(60) Provisional application No. 61/016,420, filed on Dec. 21, 2007.

(51) Int. Cl.
*C01B 31/02* (2006.01)

(52) U.S. Cl.
USPC ............ 423/445 B; 423/445 R; 252/502; 252/510; 252/511; 252/519.3; 977/735; 977/737; 977/738; 977/842

(58) Field of Classification Search
USPC ............ 252/500, 502, 510, 511; 549/29; 257/414, 428; 250/330, 336.1; 324/160; 977/742, 745, 932, 954
See application file for complete search history.

(56) References Cited

U.S. PATENT DOCUMENTS

| 5,273,729 | A | 12/1993 | Howard et al. |
| 5,294,372 | A | 3/1994 | Kochem et al. |
| 5,331,183 | A | 7/1994 | Sariftci et al. |
| 5,401,537 | A | 3/1995 | Kochem et al. |
| 5,985,232 | A | 11/1999 | Howard et al. |
| 6,162,411 | A | 12/2000 | Howard et al. |
| 6,166,172 | A | 12/2000 | McCullough et al. |
| 6,454,880 | B1 | 9/2002 | Rickman, Jr. et al. |

(Continued)

FOREIGN PATENT DOCUMENTS

| DE | 4312475 A1 | 10/1994 |
| EP | 1 566 845 A | 8/2005 |

(Continued)

OTHER PUBLICATIONS

Puplovskis et al. ("New route for [60]fullerene functionalisation in [4+2] cycloadditions reaciton using indene." Tetrahedron let. vol. 38, p. 285-288, 1997).*

(Continued)

*Primary Examiner* — Tri V Nguyen
(74) *Attorney, Agent, or Firm* — The Marbury Law Group PLLC

(57) ABSTRACT

Improved methods of fullerene derivative production including use of less solvent, or elimination of solvent, as well as use of shorter reaction times and higher reaction temperatures. Methods useful for production of bis-, tris-, tetra-, penta-, and hexa-fullerene derivatives. Indene is a preferred derivative. The derivatives used in active layers for solar cell applications.

28 Claims, 4 Drawing Sheets

A TYPICAL CONDUCTIVE POLYMER PHOTOVOLTAIC (SOLAR) CELL

(56) References Cited

U.S. PATENT DOCUMENTS

| | | | |
|---|---|---|---|
| 6,602,974 | B1 | 8/2003 | McCullough et al. |
| 7,147,936 | B2 | 12/2006 | Louwet et al. |
| 2005/0098205 | A1* | 5/2005 | Roscheisen et al. ......... 136/263 |
| 2005/0263183 | A1 | 12/2005 | Nishikitani et al. |
| 2005/0279399 | A1 | 12/2005 | Gaudiana et al. |
| 2006/0076050 | A1* | 4/2006 | Williams et al. ............. 136/263 |
| 2006/0175582 | A1 | 8/2006 | Hammond et al. |
| 2006/0278867 | A1 | 12/2006 | McCullough et al. |
| 2007/0011739 | A1 | 1/2007 | Gaudiana et al. |
| 2007/0082140 | A1* | 4/2007 | Suzuki et al. ................ 427/402 |
| 2008/0319207 | A1 | 12/2008 | Laird et al. |

FOREIGN PATENT DOCUMENTS

| | | |
|---|---|---|
| JP | 2005-116617 A | 4/2005 |
| JP | 2005-263692 A | 9/2005 |
| WO | WO 03/021018 | 3/2003 |
| WO | WO 2007/011739 A2 | 1/2007 |
| WO | WO 2008/018931 | 2/2008 |

OTHER PUBLICATIONS

Murata et al. ("Solid-state [4+2] cycloaddition of fullerene C60 with condensed aromatics using a high speed vibration milling technique." JOC vol. 64, pp. 3483-3488, Apr. 29, 1999).*
Diederich et al. ("Templated regioselective and stereoselective synthesis in fullerene chemistry." Acc. Chem. Res. vol. 32, p. 537-545, Mar. 2, 1999.*
Scrivens et al. ("Potent solvents for C60 and their utility for the rapid acquisitions of 13C NMR data for fullerenes." J. Chem. Soc., Chem. Commun., p. 1207-1211, 1993).*
Wang et al. ("The solid-phase reaction of [60]fullerene: novel additionof organozinc reagents." Chem. Commun., p. 2059-2060, 1996).*
U.S. Appl. No. 60/915,632, filed May 2, 2007, Sheina et al.
U.S. Appl. No. 60/812,961, filed Jun. 13, 2006, Laird et al.
U.S. Appl. No. 10/389,002, filed Mar. 14, 2003, Height et al.
Backer et al., "High Efficiency Organic Photovoltaics Incorporating a New Family of Soluble Fullerene Derivatives", Chem. Mater., vol. 19, pp. 2927-2929 (2007).
Belik et al., "Reaction of Buckminsterfullerene with ortho-Quinodimethane: a New Access to Stable $C_{60}$ Derivatives", Angew. Chem. Int. Ed. Engl., vol. 32, No. 1, pp. 78-80 (1993).
Birkett et al., "Preparation and $^{13}C$ NMR Spectroscopic Characterization of $C_{60}Cl_6$", J. Chem. Soc., pp. 1230-1232 (1993).
Camaioni et al., "Solar cells based on poly(3-alkyl)thiophenes and [60]fullerene: a comparative study", J. Maters. Chem., vol. 12, pp. 2065-2070 (2002).
Cioslowski et al., "Standard Enthalpies of Formation of Fullerenes and Their Dependence on Structural Motifs", J. Am. Chem. Soc., vol. 122, pp. 8265-8270 (2005).
Diener et al., "Synthesis of Single-Walled Carbon Nanotubes in Flames", J. Phys. Chem. B, vol. 104, pp. 9615-9620 (2000).
Dresselhaus et al., "Science of Fullerenes and Carbon nanotubes", Acad. Press, pp. 870-917 (1996).
Dennler et al., "Flexible Conjugated Polymer-Basd Pastic Solar Cells: From Basics to Applications", Proceedings fo the IEEE, vol. 93, No. 8, pp. 1429-1439 (2005).
Height, M. J., et al., "Flame Synthesis of Single-Walled Carbon Nanotubes," Carbon, vol. 42, pp. 2295-2307 (2004).
Height, M. J., et al., "Flame Synthesis of Single-walled Carbon Nanotubes," Proc. Combust. Inst., vol. 30, pp. 2537-2543 (2005).
Hirsch, A.; et al., "Chemistry and Reactions," Wiley-VCH Verlag, Weinheim, 2005.
Hirsch, A.; et al., "Fullerenes: Chemistry and Reactions," Wiley-Vch Verlag, Weinheim, Chapter 4, pp. 101-183 (2005).
Hoppe, H., et al., "Organic solar cells: An overview", J. Mater. Res., vol. 19, No. 7, pp. 1924-1945 (2004).
Howard, J. B., "Fullerenes Formation in Flames", Proc. Combust. Inst., vol. 24, pp. 933-946 (1992).
Howard, J. B., et al., "Carbon Shells in Flames," Nature, vol. 370, pp. 603-604 (1994).
Howard, J. B., et al., "Fullerenes $C_{60}$ and $C_{70}$ in Flames," Nature, vol. 352, pp. 139-141 (1991).
Howard, J. B., et al., "Fullerenes Synthesis in Combustion," Carbon, vol. 30, pp. 1183-1201 (1992).
Howard, J. B., et al.,"Production of $C_{60}$ and $C_{70}$ Fullerenes in Benzene-oxygen Flames," J. Phys. Chem. 1992a, vol. 96, pp. 6657-6662. (1992).
Hummelen, J. C.; et al.,"Preparation and Characterization of Fulleroid and Methanofullerene Derivatives," J. Org. Chem., vol. 60, pp. 532-538 (1995).
Imahori et al., "Donor-Linked Fullerenes: Photoinduced Electron Transfer and Its Potential Application", Adv. Mater., vol. 9, No. 7, pp. 537-546 (1997).
Inoue, K., et al., "High Efficiency P3HT/PCBM Solar Cell," Mater. Res. Symp. Proc., vol. 836, pp. 69-80 (2005).
Kadish, K. M.; et al.,"Fullerenes: Chemistry, Physics and Technology," Wiley-Interscience, New York, 2000.
Kim, J., "Assemblies of conjugated polymers. Intermolecular and intramolecular effects on the photophysical properties of conjugated polymers", Pure Appl. Chem., vol. 74, No. 11, pp. 2031-2044, (2002).
Kitagawa, T.; et al.,"Electrophilic Addition of Polychloroalkanes to C60: Direct Observation of Alkylfullerenyl Cation Intermediates," J. Am. Chem. Soc., vol. 121, 4298-4299 (1999).
Koster, L. J. A.; et al., "Ultimate Efficiency of Polymer/Fullerene Bulk Heterojunction Solar Cells," Appl. Phys. Lett., vol. 88, pp. 093511-093511-3 (2006).
Krätschmer, W., et al., "Solid $C_{60}$: A New Form of Carbon," Nature, vol. 347, pp. 354-358 (1990).
Lamparth, I., et al., "Water-soluble Malonic Acid Derivatives of $C_{60}$ with a Defined Three-dimensional Structure Has Been Demonstrated Successfully," J. Chem. Soc., Chem. Commun., pp. 1727-1728 (1994).
Li, G., et al., "High-efficiency solution processable polymer photovoltaic cells by self-organization of polymer blends", Nature of Materials, vol. 4, pp. 864-868 (2005).
Loewe, R. S., et al. "A Simple Method to Prepare Head-to-Tail Coupled, Regioregular Poly(3-alkylthiophenes) Using Grignard Metathesis", Adv. Mater., vol. 11, pp. 250-253 (1999).
March, J., Advanced Organic Chemistry, "Reactions, Mechanisms, and Structure", $2^{nd}$ Ed., (1977).
Martin, L. S., "Modified Fullerenes for Light-to-Electrical Energy Conversion", Echos 06, Jun. 28-30, 2006, Paris France.
McCullough, R. D.; et al., "Self-Orienting Head-to-Tail Poly(3-alkylthiophenes): New Insights on Structure-Property Relationships in Conducting Polymers", J. Am. Chem. Soc., vol. 115, pp. 4910-4911 (1993).
Meijer et al., Materials Science and Engineering, vol. 32, pp. 1-40 (2001).
Neugebauer et al., "Photophysics and photovoltaic device properties of phthalocyanine-fullerene dyad:conjugates polymer mixtures", Solar Energy Maters. & Solar Cells, vol. 83, No. 2-3, pp. 201-209 (2004).
Peeters, E., et al., "Synthesis, Photophysical Properties, and Photovoltaic Devices of Oligo(p-phenylene vinylene)-fullerene Dyads", J. Phys. Chem. B, vol. 104, pp. 10174-10190 (2000).
Perlin, J., "The Silicon Solar Cell Turns 50," NREL, Report No. BR-520-339047 (4 pages)(2004).
Puplovskis, A., et al., "New Route for [60]Fullerene Functionalisation in [4+2] Cycloadditioni Reaction Using Indene", Tetrahedron Letters, vol. 38, No. 2, pp. 285-288 (1997).
Reyes-Reyes, M., et al., "High-efficiency photovoltaic devices based on annealed poly(3-hexylthiophene) and 1-(3-methoxycarbonyl)-propyl-1-phenyl-(6,6)$C_{61}$ blends", App. Phys. Let., vol. 87, pp. 08350-083506-3 (2005).
Reyes-Reyes, M., et al., "Meso-Structure Formation for Enhanced Organic Photovoltaic Cells", Organic Letts, vol. 7, pp. 5749-5752 (2005).
Richter, H., et al., "A. Combustion Synthesis of Fullerenes," Mat. Res. Soc. Symp. Proc., vol. 359, pp. 17-22 (1995).

(56) References Cited

OTHER PUBLICATIONS

Richter, H., et al., "A. Fabrication of Fullerenes in Benzene/Oxygen/Argon- and Benzene/Acetylene/Oxygen/Argon Flames," *J. Chim. Phys.*, vol. 92, pp. 1272-1285 (1995).

Richter, H., et al., "Addition of HCl, $Cl_2$, $CoCl_2$ and KI to Fullerene Forming Benzene/oxygen/argon Flames," *Synthetic Metals*, vol. 77, pp. 217-221 (1996).

Richter, H., et al., "Detailed Modeling of PAH and Soot Formation in a Laminar Premixed Benzene/Oxygen/Argon Low-Pressure Flame," *Proc. Combust. Inst.*, vol. 30, pp. 1397-1405 (2005).

Richter, H., et al., "Formation and Consumption of Single-Ring Aromatic Hydrocarbons and their Precursors in Premixed Acetylene, Ethylene and Benzene Flames," *Phys. Chem. Chem. Phys.*, vol. 4, pp. 2038-2055 (2002).

Richter, H., et al., "Formation Mechanism of Polycyclic Aromatic Hydrocarbons and Fullerenes in Premixed Benzene Flames," *Combust. Flame*, vol. 119, pp. 1-22 (1999).

Richter, H., et al., "Formation of Nanotubes in Low-pressure Hydrocarbon Flames," *Carbon*, vol. 34, pp. 427-429 (1996).

Richter, H., et al., "Formation of Polycyclic Aromatic Hydrocarbons and their Radicals in a Nearly Sooting Premixed Benzene Flame," *Proc. Combust. Inst.*, vol. 28, pp. 2609-2618 (2000).

Richter, H., et al., "From Academic Soot Research to Commercial Synthesis of Single-walled Carbon Nanotubes," AICHE Fall Meeting, Cincinnati, pp. 1-8 (2005).

Richter, H., et al., "Generation of Higher Fullerenes in Flames," *J. Phys. Chem. B*, vol. 101, pp. 1556-1560 (1997).

Richter, H., et al., "Industrial Production of Fullerenic Materials," *Prepr. Pap.—Am. Chem. Soc., Div. Fuel Chem.*, vol. 51, No. 1, pp. 91-92 (2006).

Riedel et al., "Diphenylmethanofullerenes: New and Efficient Acceptors in Bulk-Heterojunction Solar Cells", Adv. Funct. Mater., vol. 15, pp. 1979-1987 (2005).

Ruoff, R. S., et al., "Solubility of $C_{60}$ in a Variety of Solvents," *J. Phys. Chem.*, vol. 97, pp. 3379-3383 (1993).

Sanchez, L., et al., "C60-exTTF-C60 Dumbbells" Cooperative Effects Stemming from Two C60s on the Radical Ion Pair Stabilization, vol. 7, No. 9, pp. 1691-1694 (2005).

Segura et al., "Design, synthesis and photovoltaic properties of [60]fullerene based molecular materials", Maters. Sci. and Engin., vol. 25, pp. 835-842 (2005).

Shirakawa, T., et al., "Doping effects of novel fullerene derivatives in conducting polymer", Elsevier, Syntheitc Metals, vol. 137, pp. 1415-1416 (2003).

Skotheim, T. A., *Handbook of Conducting Polymers*, 3$^{rd}$ Ed. (two vol), 2007.

Smith, M. B. and March, J., *March's Advanced Organic Chemistry*, "Reactions, Mechanisms, and Structure", 5th Ed, (2001).

Tebbe, F. N., et al., "Synthesis and Single-Crystal X-ray Structure of a Highly Symmetrical $C_{60}$ Derivative, $C_{60}Br_{24}$," *Science*, vol. 256, pp. 822-825 (1992).

Van Mullekom, H.A.M., et al., "Developments in the chemistry and band gap engineering of donor-acceptor substituted conjugated polymers", *Materials Science and Engineering*, vol. 32 pp. 1-40 (2001).

Vostrowsky, O., et al., "Heterofullerenes," Chem. Rev., vol. 106, pp. 5191-5207 (2006).

Waldauf et al., "Efficient charge carrier transfer from m-LPPP to C60 derivatives", Optical Maters., vol. 9, pp. 449-453 (1998).

Wang et al., "Polymers containing fullerene or carbon nanotube structures", Prog. Polym. Sci., vol. 29, pp. 1079-1141 (2004).

Wang, X., et al., "Infrared photocurrent spectral response from plastic solar cell with low-band-gap polyfluorene and fullerene derivative", Appl. Phys. Letts., vol. 85, No. 21, pp. 5081-5083 (2004).

Wienk, M. M., et al., "Efficient Methano[70]fullerene/MDMO-PPV Bulk Heterojunction Photovoltaic Cells," *Angew. Chem. Int. Ed.*, vol. 42, pp. 3371-3375 (2003).

Yang et al., Nature of Maters., vol. 4, pp. 864-868 (2005).

Yu, J., et al., "Accurate and Efficient Method for Predicting Thermochemistry of Polycyclic Aromatic Hydrocarbons—Bond Centered Group Additivity," *J. Am. Chem. Soc.*, vol. 126, pp. 12685-12700 (2004).

International Search Report and Written Opinion mailed May 28, 2010 in corresponding International Application No. PCT/US2008/087850.

* cited by examiner

ORGANIC PHOTOVOLTAIC DEVICES COMPRISING FULLERENES AND DERIVATIVES THEREOF AND IMPROVED METHODS OF MAKING FULLERENE DERIVATIVES

CROSS REFERENCE TO RELATED APPLICATIONS

This application claims priority to U.S. provisional application Ser. No. 61/016,420 filed Dec. 21, 2007 to Laird et al., which is hereby incorporated by reference in its entirety.

BACKGROUND

A need exists to provide better materials and processes for organic photovoltaic (OPV) devices. This is driven in part by ongoing high fuel prices and unstable fuel supply. OPV devices can provide improvements over older silicon devices. See for example Perlin, John "The Silicon Solar Cell Turns 50" NREL 2004; see also, Dennler et al., "Flexible Conjugated Polymer-Based Plastic Solar Cells: From Basics to Applications," *Proceedings of the IEEE*, vol. 93, no. 8, August 2005, 1429-1439. Global climate change is also a motivating factor. While it is known that conducting polymers, or conjugated polymers, including for example polythiophenes can be combined with C60 fullerene to provide useful active materials in OPV devices, a need yet remains to improve device efficiency and other important PV parameters. In particular, regioregular polythiophenes are of particular importance because of their nanoscale morphology which can be applied to novel morphologies for solar cell applications.

SUMMARY

Provided herein are, among other things, compositions, mixtures, devices, methods of making, and methods of using.

For example, one embodiment provides a method comprising: reacting at least one fullerene with indene, at least one substituted indene, or a combination thereof in substantial absence of any solvent in addition to indene or the substituted indene.

Another embodiment provides a method comprising: reacting indene, substituted indene, or a combination thereof with at least one fullerene under reaction conditions wherein the most abundant reaction product is a bis-derivative, a tris-derivative, a tetra-derivative, a penta-derivative, or a hexa-derivative.

Another embodiment provides a method comprising: reacting at least one C60 fullerene with indene in substantial absence of any solvent in addition to indene.

Another embodiment provides a composition comprising at least one fullerene derivative represented by:

$$F^*\text{-}(R)_n$$

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

Another embodiment provides a method comprising: reacting at least one fullerene with indene, at least one substituted indene, or a combination thereof in the presence of at least one additional solvent, wherein the volume amount of indene, substituted indene, or combination thereof is greater than the volume amount of the additional solvent.

In another example, provided herein is a composition comprising a mixture comprising: (i) at least one p-type material, (ii) at least one n-type material, wherein the n-type material comprises a fullerene derivative represented by:

$$F^*\text{-}(R)_n$$

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

Another embodiment provides a composition comprising a mixture comprising: (i) at least one p-type material, (ii) at least one n-type material, wherein the n-type material comprises at least one fullerene derivative comprising at least one [6,6] fullerene bonding site wherein both carbon atoms of the [6,6] bonding site are covalently bonded to a group R.

Another embodiment provides a composition comprising a mixture comprising: (i) at least one p-type material, (ii) at least one n-type material, wherein the n-type material comprises a fullerene derivative comprising at least one fullerene covalently bonded by [4+2] cycloaddition to at least one derivative moiety.

Another embodiment provides a photovoltaic device comprising at least one anode, at least one cathode, and at least one active layer, wherein the active layer comprises a composition comprising a mixture comprising: (i) at least one p-type material, (ii) at least one n-type material, wherein the n-type material comprises a fullerene derivative represented by:

$$F^*\text{-}(R)_n$$

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

Another embodiment comprises a method of making a composition comprising a mixture comprising: (i) providing at least one p-type material, (ii) providing at least one n-type material, wherein the n-type material comprises a fullerene derivative represented by:

$$F^*\text{-}(R)_n$$

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

(iii) combining the p-type and n-type materials to form the mixture, wherein the mixture further comprises at least one solvent.

In one or more embodiments, advantages include, for example, substantially better photovoltaic efficiency, versatility with a variety of active layer systems which can be tuned to particular applications, improved device lifetime, and improved material and device processability. Better, more commercially attractive methods of making fullerene derivatives are described.

DETAILED DESCRIPTION

Introduction & Definitions

Figure 1:
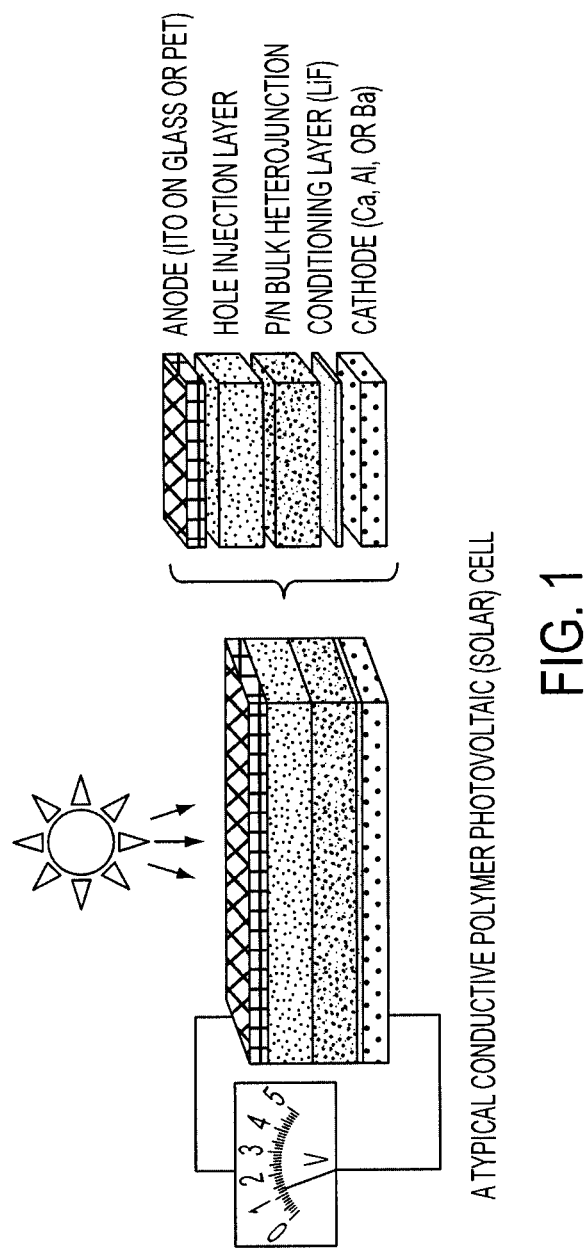
FIG. 1 shows a typical conductive polymer photovoltaic (solar cell).

U.S. provisional application Ser. No. 60/812,961 filed Jun. 13, 2006, U.S. provisional application Ser. No. 61/016,420 filed Dec. 21, 2007, and U.S. regular application Ser. No. 11/743,587 are each hereby incorporated by reference in their entireties.

"Optionally substituted" groups refers to functional groups that may be substituted or unsubstituted by additional functional groups. When a group is unsubstituted by an additional group is may be referred to as a group name, for example alkyl or aryl. When a group is substituted with additional functional groups it may more generically be referred to as substituted alkyl or substituted aryl.

"Carbocyclic" refers to a cyclic arrangement of carbon atoms forming a ring including for example benzene or cyclohexane. Carbocyclic includes both cycloalkyl and aryl groups. The term "cycloalkyl" refers to cyclic alkyl groups of from 3 to 20 carbon atoms having single or multiple condensed cyclic rings which condensed rings may or may not be aromatic provided that the point of attachment is not at an aromatic carbon atom. "Aryl" refers to an aromatic carbocyclic group of from 6 to 20 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include phenyl, naphthyl, and the like.

"Heterocyclic" refers to a saturated, unsaturated, or heteroaromatic group having a single ring or multiple condensed rings, from 1 to 20 carbon atoms and from 1 to 4 heteroatoms, selected from nitrogen, oxygen, sulfur, —S(O)— and —S(O)$_2$— within the ring. Such heterocyclic groups can have a single ring (e.g., pyridyl or furyl) or multiple condensed rings (e.g., indolizinyl or benzothienyl) wherein the condensed rings may or may not be aromatic and/or contain a heteroatom provided that the point of attachment is through an atom of the aromatic heteroaryl group. Heterocyclic groups can be for example, pyridine, or thiophene, or furan or tetrahydrofuran, pyrrole, tetrahydropyrrole, pyran, and the like. The term heterocyclic includes heteroaryl groups where "heteroaryl" refers to an aromatic group of from 1 to 20 carbon atoms and 1 to 4 heteroatoms selected from the group consisting of oxygen, nitrogen, sulfur, —S(O)—, and —S(O)$_2$— within the ring. Heteroaryls include pyridyl, pyrrolyl, indolyl, thiophenyl, and furyl.

"Alkyl" refers to straight chain and branched alkyl groups having from 1 to 20 carbon atoms, or from 1 to 15 carbon atoms, or from 1 to 10, or from 1 to 5, or from 1 to 3 carbon atoms. This term is exemplified by groups such as methyl, ethyl, n-propyl, iso-propyl, n-butyl, t-butyl, n-pentyl, ethylhexyl, dodecyl, isopentyl, and the like.

"Substituted alkyl" refers to an alkyl group having from 1 to 3, and preferably 1 to 2, substituents selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

The terms "Substituted carbocyclic," "substituted aryl," "substituted cycloalkyl," "substituted heterocyclic," and "substituted heteroaryl refer to carbocyclic, aryl, cycloalkyl, heterocyclic, or heteroaryl groups with from 1 to 5 substituents, or optionally from 1 to 3 substituents, or optionally from 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Alkoxy" refers to the group "alkyl-O—" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like.

"Substituted alkoxy" refers to the group "substituted alkyl-O—."

"Alkenyl" refers to alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" refers to alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" refers to the group aryl-O— that includes, by way of example, phenoxy, naphthoxy, and the like.

"Alkoxy" refers to the group "alkyl-O—" which includes, by way of example, methoxy, ethoxy, n-propoxy, iso-propoxy, n-butoxy, t-butoxy, sec-butoxy, n-pentoxy and the like.

"Substituted alkoxy" refers to the group "substituted alkyl-O—".

"Acyl" refers to the groups H—C(O)—, alkyl-C(O)—, substituted alkyl-C(O)—, alkenyl-C(O)—, substituted alkenyl-C(O)—, alkynyl-C(O)—, substituted alkynyl-C(O)— cycloalkyl-C(O)—, substituted cycloalkyl-C(O)—, aryl-C(O)—, substituted aryl-C(O)—, heteroaryl-C(O)—, substituted heteroaryl-C(O), heterocyclic-C(O)—, and substituted heterocyclic-C(O)— wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Acylamino" refers to the group —C(O)NRR where each R is independently selected from the group consisting of hydrogen, alkyl, substituted alkyl, alkenyl, substituted alkenyl, alkynyl, substituted alkynyl, aryl, substituted aryl, cycloalkyl, substituted cycloalkyl, heteroaryl, substituted heteroaryl, heterocyclic, substituted heterocyclic and where each R is joined to form together with the nitrogen atom a heterocyclic or substituted heterocyclic ring wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Acyloxy" refers to the groups alkyl-C(O)O—, substituted alkyl-C(O)O—, alkenyl-C(O)O—, substituted alkenyl-C(O)O—, alkynyl-C(O)O—, substituted alkynyl-C(O)O—, aryl-C(O)O—, substituted aryl-C(O)O—, cycloalkyl-C(O)O—, substituted cycloalkyl-C(O)O—, heteroaryl-C(O)O—, substituted heteroaryl-C(O)O—, heterocyclic-C(O)O—, and substituted heterocyclic-C(O)O— wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Alkynyl" refers to alkynyl group preferably having from 2 to 6 carbon atoms and more preferably 2 to 3 carbon atoms and having at least 1 and preferably from 1-2 sites of alkynyl unsaturation.

"Substituted alkynyl" refers to alkynyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Amino" refers to the group —$NH_2$.

"Substituted amino" refers to the group —NR'R" where R' and R" are independently selected from the group consisting of hydrogen, alkyl, substituted alkyl, alkenyl, substituted alkenyl, alkynyl, substituted alkynyl, aryl, substituted aryl, cycloalkyl, substituted cycloalkyl, heteroaryl, substituted heteroaryl, heterocyclic, substituted heterocyclic and where R' and R" are joined, together with the nitrogen bound thereto to form a heterocyclic or substituted heterocyclic group provided that R' and R" are both not hydrogen. When R' is hydrogen and R" is alkyl, the substituted amino group is sometimes referred to herein as alkylamino. When R' and R" are alkyl, the substituted amino group is sometimes referred to herein as dialkylamino.

"Aminoacyl" refers to the groups —NRC(O)alkyl, —NRC(O)substituted alkyl, —NRC(O)cycloalkyl, —NRC(O)substituted cycloalkyl, —NRC(O)alkenyl, —NRC(O)substituted alkenyl, —NRC(O)alkynyl, —NRC(O)substituted alkynyl, —NRC(O)aryl, —NRC(O)substituted aryl, —NRC(O)heteroaryl, —NRC(O)substituted heteroaryl, —NRC(O)heterocyclic, and —NRC(O)substituted heterocyclic where R is hydrogen or alkyl and wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Carboxyl" refers to —COOH or salts thereof.

"Carboxyl esters" refers to the groups —C(O)O-alkyl, —C(O)O-substituted alkyl, —C(O)Oaryl, and —C(O)O-substituted aryl wherein alkyl, substituted alkyl, aryl and substituted aryl are as defined herein.

"Cycloalkoxy" refers to —O-cycloalkyl groups.

"Substituted cycloalkoxy" refers to —O-substituted cycloalkyl groups.

"Halo" or "halogen" refers to fluoro, chloro, bromo and iodo.

"Heteroaryloxy" refers to the group —O-heteroaryl and "substituted heteroaryloxy" refers to the group —O-substituted heteroaryl.

"Heterocyclyloxy" refers to the group —O-heterocyclic and "substituted heterocyclyloxy" refers to the group —O-substituted heterocyclic.

"Thiol" refers to the group —SH.

"Thioalkyl" or "alkylthioether" or "thioalkoxy" refers to the group —S-alkyl.

"Substituted thioalkyl" or "substituted alkylthioether" or "substituted thioalkoxy" refers to the group —S-substituted alkyl.

"Thiocycloalkyl" refers to the groups —S-cycloalkyl and "substituted thiocycloalkyl" refers to the group —S-substituted cycloalkyl.

"Thioaryl" refers to the group —S-aryl and "substituted thioaryl" refers to the group —S-substituted aryl.

"Thioheteroaryl" refers to the group —S-heteroaryl and "substituted thioheteroaryl" refers to the group —S-substituted heteroaryl.

"Thioheterocyclic" refers to the group —S-heterocyclic and "substituted thioheterocyclic" refers to the group —S-substituted heterocyclic.

"Salts" are derived from a variety of organic and inorganic counter ions well known in the art and include, by way of example only, sodium, potassium, calcium, magnesium, ammonium, tetraalkylammonium, and the like; and when the molecule contains a basic functionality, salts of organic or inorganic acids, such as hydrochloride, hydrobromide, tartrate, mesylate, acetate, maleate, oxalate and the like.

"Solvate" refers to those forms of the compounds which form, in the solid or liquid state, a complex by coordination with solvent-molecules. Hydrates are a specific form of solvates in which the coordination takes place with water.

"Conjugated polymer" refers to polymers comprising at least some conjugated unsaturation in the backbone.

"A polythiophene" or "polythiophene" refers to polymers comprising a thiophene in the backbone including polythiophene, derivatives thereof, and copolymers and terpolymers thereof.

"Regioregular polythiophene" refers to polythiophene having high levels of regioregularity including for example at least 80%, or at least 90%, or at least 95%, or at least 98%, or at least 99%.

It is understood that in all substituted groups defined above, polymers arrived at by defining substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above definitions is constrained by a limitation that, for example, substituted aryl groups are limited to -substituted aryl-(substituted aryl)-substituted aryl.

Similarly, it is understood that the above definitions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

Other terms used herein are defined as follows, unless the context makes clear otherwise.

All references cited herein are incorporated by reference in their entirety.

Solar cells are described in for example Hoppe and Sariciftci, *J. Mater. Res.*, Vol. 19, No. 7, July 2004, 1924-1945, which is hereby incorporated by reference including the figures.

FIG. 1 illustrates some components of a conventional solar cell. See also for example Dennler et al., "Flexible Conjugated Polymer-Based Plastic Solar Cells: From Basics to Applications," Proceedings of the IEEE, vol. 93, no. 8, August 2005, 1429-1439, including FIGS. 4 and 5. Various architectures for the solar cell can be used, including inverted solar cells. Important elements include the active layer, an anode, a cathode, and a substrate to support the larger structure. In addition, a hole injection layer can be used, and one or more conditioning layers can be used. The active layer can comprise a P/N composite including a P/N bulk heterojunction.

The following references describe photovoltaic materials and devices:

US Patent Publication 2006/0076050 to Williams et al., "Heteroatomic Regioregular Poly(3-Substitutedthiophenes) for Photovoltaic Cells," (Plextronics) which is hereby incorporated by reference including working examples and drawings.

US Patent Publication 2006/0237695 (Plextronics), "Copolymers of Soluble Poly(thiophenes) with Improved Electronic Performance," which is hereby incorporated by reference including working examples and drawings.

U.S. Pat. No. 7,147,936 to Louwet et al.

In addition, US Patent Publication 2006/0175582 "Hole Injection/Transport Layer Compositions and Devices" describes hole injection layer technology, (Plextronics) which is hereby incorporated by reference including working examples and drawings.

Device Elements Other than the Active Layer

Electrodes, including anodes and cathodes, are known in the art for photovoltaic devices. See, for example, Hoppe et al. article cited above. Known electrode materials can be used. Transparent conductive oxides can be used. Transparency can be adapted for a particular application. For example, the anode can be indium tin oxide, including ITO supported on a substrate. Substrates can be rigid or flexible.

If desired, hole injection and hole transport layers can be used. An HIL layer can be for example PEDOT:PSS as known in the art. See, for example, Hoppe et al. article cited above.

Active Layer p-Type Material

The active layer can comprise at least one p-type material, and the fullerene derivative n-type materials can be used in combination with various p-type materials. The advantage of some embodiments of the invention is that the substituents used to derivatize the fullerene can be chosen based on the calculated LUMO level or the calculated electron affinity. The goal in these embodiments can be to maximize the difference between the LUMO level of the n-type with the HOMO level of the p-type, while still maintaining photo carrier generation within the active layer.

The p-type material can be an organic material including a polymeric material, although other types of p-type material are known in the art. For example, the p-type material can comprise a conjugated polymer or a conducting polymer, comprising a polymer backbone having a series of conjugated double bonds. It can be a homopolymer or a copolymer including a block copolymer or a random copolymer, or a terpolymer. Examples include polythiophene, polypyrrole, polyaniline, polyfluorene, polyphenylene, polyphenylene vinylene, and derivatives, copolymers, and mixtures thereof. The p-type material can comprise a conjugated polymer soluble or dispersible in organic solvent or water. Conjugated polymers are described in for example T. A. Skotheim, *Handbook of Conducting Polymers*, 3$^{rd}$ Ed. (two vol), 2007; Meijer et al., *Materials Science and Engineering*, 32 (2001), 1-40; and Kim, *Pure Appl. Chem.*, 74, 11, 2031-2044, 2002. The p-type active material can comprise a member of a family of similar polymers which have a common polymer backbone but are different in the derivatized side groups to tailor the properties of the polymer. For example, a polythiophene can be derivatized with alkyl side groups including methyl, ethyl, hexyl, dodecyl, and the like.

One embodiment comprises copolymers and block copolymers which comprise, for example, a combination of conjugated and non-conjugated polymer segments, or a combination of a first type of conjugated segment and a second type of conjugated segment. For example, these can be represented by AB or ABA or BAB systems wherein, for example, one block such as A is a conjugated block and another block such as B is an non-conjugated block or an insulating block. Or alternately, each block A and B can be conjugated. The non-conjugated or insulating block can be for example an organic polymer block, an inorganic polymer block, or a hybrid organic-inorganic polymer block including for example addition polymer block or condensation polymer block including for example thermoplastic types of polymers, polyolefins, polysilanes, polyesters, PET, and the like. Block copolymers are described in, for example, U.S. Pat. No. 6,602,974 to McCullough et al., and US Patent Publication No. 2006/0278867 to McCullough et al. published Dec. 14, 2006, each incorporated herein by reference in its entirety.

In particular, polythiophenes and derivatives thereof are known in the art. They can be homopolymers or copolymers, including block copolymers. They can be soluble or dispersible. They can be regioregular. In particular, optionally substituted-alkoxy- and optionally substituted alkyl-substituted polythiophenes can be used. In particular, regioregular polythiophenes can be used as described in for example U.S. Pat. Nos. 6,602,974 and 6,166,172 to McCullough et al., as well as McCullough, R. D.; Tristram-Nagle, S.; Williams, S. P.; Lowe, R. D.; Jayaraman, M. J. Am. Chem. Soc. 1993, 115, 4910, including homopolymers and block copolymers. See also Plextronics (Pittsburgh, Pa.) commercial products. Soluble alkyl- and alkoxy-substituted polymers and copolymers can be used including poly(3-hexylthiophene). Other examples can be found in U.S. Pat. Nos. 5,294,372 and 5,401,537 to Kochem et al. U.S. Pat. Nos. 6,454,880 and 5,331,183 further describe active layers.

Soluble materials or well dispersed materials can be used in the stack to facilitate processing.

Additional examples of p-type materials and polythiophenes can be found in WO 2007/011739 (Gaudiana et al.) which describes polymers having monomers which are, for example, substituted cyclopentadithiophene moieties, and which is hereby incorporated by reference in its entirety including formulas.

Active Layer n-Type Material

The active layer can comprise an n-type material comprising at least one fullerene structure. Fullerenes are known in the art. Fullerenes can be described as spheroidal carbon compounds. For example, the fullerene surface can present [6,6] bonding and [6,5] bonding as known in the art. The fullerene can have a surface comprising six-membered and five-membered rings. Fullerenes can be for example C60, C70, or C84, and additional carbon atoms can be added via derivative groups. See for example Hirsch, A.; Brettreich, M., *Fullerenes: Chemistry and Reactions*, Wiley-VCH Verlag, Weinheim, 2005, which is hereby incorporated by reference including teachings for fullerene nomenclature and synthesis, derivatization, reduction reactions (Chapter 2), nucleophilic additions (Chapter 3), cycloadditions (Chapter 4), hydrogenation (Chapter 5), radical additions (Chapter 6), transition metal complex formation (Chapter 7), oxidation and reactions with electrophiles (Chapter 8), halogenation (Chapter 9), regiochemistry (Chapter 10), cluster modification (Chapter 11), heterofullerenes (Chapter 12), and higher fullerenes (Chapter 13). Methods described herein can be used to synthesize fullerene derivatives and adducts.

In particular, the active layer can comprise at least one n-type material, wherein the n-type material comprises at least one derivatized fullerene or fullerene derivative. The derivative compound can be for example an adduct. The terms "derivatized fullerene," "fullerene derivative" as used herein, can be used interchangeably and can be for example fullerenes comprising, from 1 to 84, or 1 to 70, or 1 to 60, from 1 to 20, from 1 to 18, from one to ten, or from one to six, or from one to five, or from one to three substituents each covalently bonded to, for example, one or two carbons in the spheroidal carbon compounds. The derivatized fullerene can comprise a fullerene covalently bonded by [4+2] cycloaddition to at least one derivative moiety, R.

Structures for the n-type material can be represented by:

and solvates, salts, and mixtures thereof,
wherein
n is at least one;
F is a spheroidal fullerene having a surface which comprises six-membered and five-membered rings; and
R comprises at least one optionally substituted, unsaturated or saturated, carbocyclic or heterocyclic first ring, wherein the first ring directly bonds to the fullerene.

Formula (I) represents an embodiment wherein C60 is bonded to n R groups, and the bonding is generically represented.

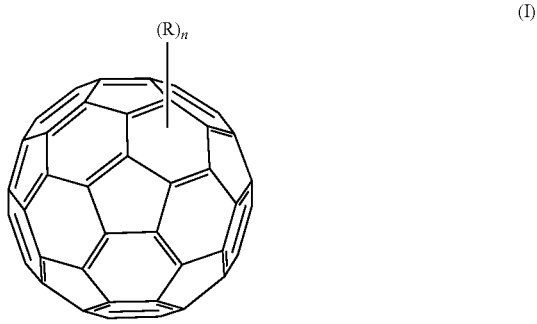
(I)

The first ring can be substituted. The first ring can be not substituted. The first ring can be an unsaturated ring. The first ring can be a saturated ring. The first ring can be a carbocyclic ring. The first ring can be a heterocyclic ring.

The first ring can be an optionally substituted four-membered, five-membered, or six-membered ring. It can in particular be an optionally substituted five-membered ring.

The R group can further comprise a second ring which is bonded to or fused with the first ring. The second ring can be optionally substituted. The second ring can be for example an aryl group which is fused to the first ring.

The first ring directly bonds to the fullerene. For example, the R group can covalently bond to the fullerene by a [4+2] cycloaddition. The R group can be covalently bonded to the fullerene by one or two covalent bonds, including two covalent bonds, including by two carbon-carbon bonds. The R group can be bonded to the fullerene surface by a covalent bond to one atom in the R group. Alternatively the R group can be bonded to the fullerene surface by covalent bonds to two atoms in the R group. The two atoms in the R group bonded to the fullerene can be adjacent to each other, or can be separated by from each other by 1 to 3 other atoms in the R group. The R group can be covalently bonded to the fullerene by two carbon-carbon bonds at a fullerene [6,6] position.

The fullerene can comprise only carbon. The fullerene can comprise at least one derivative group bonded to the fullerene besides R.

For example, fullerenes can be derivatized with electron withdrawing groups or electron releasing groups. Electron withdrawing groups and electron releasing groups are known in the art and can be found in *Advanced Organic Chemistry*, 5th Ed, by Smith, March, 2001.

The electron withdrawing group can be attached directly to the fullerene cage or via methano-bridges similar to the PCBM structure.

The electron donating group can be attached directly to the fullerene cage or via methano-bridges similar to the PCBM structure.

Fullerenes can be derivatized to improve their absorption in the visible range, relative to C60-PCBM. Improved absorption in the visible range may increase or improve the photocurrent of a photovoltaic device comprising the derivatized fullerene.

In one embodiment, F* is selected from C60, C70 and C84, and combinations thereof.

In one embodiment, R is selected from optionally substituted aryl and optionally substituted heteroaryl.

In one embodiment, R is selected from optionally substituted indene, optionally substituted naphthyl, optionally substituted phenyl, optionally substituted pyridinyl, optionally substituted quinolinyl, optionally substituted cyclohexyl, and optionally substituted cyclopentyl.

In one embodiment R is selected from indene, naphthyl, phenyl, pyridinyl, quinolinyl, cyclohexyl and cyclopentyl.

The value n can be an integer. In one embodiment, n can be from 1 to 84, or from 1 to 70, or from 1 to 60, or from 1 to 30, or from 1 to 10. In one embodiment n is from 1 to 6. In one embodiment n is from 1 to 3.

In one embodiment n is 1. In one embodiment n is 2. In one embodiment n is 3.

In one embodiment, the first ring is optionally substituted with at least one substituent selected from the group consisting of hydroxy, acyl, acylamino, acyloxy, alkyl, substituted alkyl, alkoxy, substituted alkoxy, alkenyl, substituted alkenyl, alkynyl, substituted alkynyl, amino, substituted amino, aminoacyl, aryl, substituted aryl, aryloxy, substituted aryloxy, cycloalkoxy, substituted cycloalkoxy, carboxyl, carboxyl esters, cyano, thiol, thioalkyl, substituted thioalkyl, thioaryl, substituted thioaryl, thioheteroaryl, substituted thioheteroaryl, thiocycloalkyl, substituted thiocycloalkyl, thioheterocyclic, substituted thioheterocyclic, cycloalkyl, substituted cycloalkyl, halo, nitro, heteroaryl, substituted heteroaryl, heterocyclic, substituted heterocyclic, heteroaryloxy, substituted heteroaryloxy, heterocyclyloxy, or substituted heterocyclyloxy, or combination thereof.

In one embodiment n is 1 and R is indene. In one embodiment n is 2 and R is indene. In one embodiment n is 3 and R is indene. In one embodiment n is 4 and R is indene. In one embodiment n is 5 and R is indene. In one embodiment n is 6 and R is indene.

In one embodiment, R can be covalently bonded to the fullerene by [4+2] cycloaddition, alternatively called a [4+2] cycloadduct. Reactions including [4+2] cycloaddition reactions and Diels-Alder reactions are generally known in the art. A dienophile double bond can react with a diene to produce a six membered ring. See for example *Advanced Organic Chemistry, Reactions, Mechanisms, and Structure,*

2nd Ed., J. March, 1977, including chapters on addition to carbon-carbon multiple bonds (e.g., Chapter 15). See also, Belik et al., *Angew. Chem. Int. Ed. Engl.* 1993, 32, 1, 78-80 (showing reaction of C60 with a C8 o-quinodimethane compound to form a C68 compound comprising the fullerene and the derivative moiety); and Puplovskis et al., *Tetrahedron Letters*, 38, 2, 285-288, 1997, 285-288 (showing reaction of C60 with C9 indene to form a C69 compound comprising the fullerene and the derivative moiety). The cycloaddition reaction can result in reaction at the [6,6] fullerene double bonds rather than [6,5] double bonds. Cycloaddition reactions are described in detail in Chapter 4, pages 101-183, of the Hirsch, Brettreich text, *Fullerenes, Chemistry and Reactions,* 2005.

One example of a fullerene derivative is an indene derivative. In addition, indene itself can be derivatized. Fullerene can be derivatized by methods described in for example Belik et al., Angew. Chem. Int. Ed. Engl., 1993, 32, No. 1, pages 78-80, which is hereby incorporated by reference. This paper describes addition to electron poor superalkene, C60, which can add radicals such as o-quinodimethane. It can be prepared in situ containing different functional groups and form very reactive dienes that can form [4+2] cycloadducts even with the least reactive dienophiles. This method provides good selectivity and stability.

The fullerene can comprise at least two derivative moieties, R, to form bis-adducts or at least three derivative moieties, R, to form tris-adducts. These substituents can be added to the fullerene by [4+2] cycloaddition. For example, Belik et al. show in Scheme 1, formula 3, a fullerene compound comprising two derivative moieties. In addition, two fullerenes can be covalently linked by one derivative moiety as shown in Scheme 2 of Belik et al.

While the various embodiments are not limited by theory, it is believed that the derivatization may disrupt the conjugation of the fullerene cage. Disrupting the conjugation effects the ionization potential and electron affinity of the derivatized fullerene.

In one embodiment, the active layer can comprise at least one polythiophene and at least one fullerene derivative comprising an electron withdrawing group.

Isolation of Reaction Products

Under conditions where fullerenes react to form fullerene derivatives, many reaction products may be produced. When it is desirable to make use of only a subset of these reaction products in downstream processing steps, they may be isolated using one or more separation methods. One example of a suitable separation method is chromatography.

In liquid-solid chromatography, for example, a liquid mobile phase comprising the reaction products is contacted with a solid stationary phase in a column. The stationary phase generally has a large surface accessible to the paths through which the liquid mobile phase flows. The mobile phase generally flows from one or more inlets to one or more outlets, contacting the accessible surface of the stationary phase. One or more detectors may be located at or near the column outlets, in order to characterize the composition of the mobile phase present there at a given time. Bands of concentrated material are referred to as peaks, because of the patterns that would be traced if a detector output were plotted over time.

As the mobile phase flows past the surface of the stationary phase, some compounds may adsorb to the surface readily, others not as readily, and others not at all. These compounds may later desorb from the surface, as well, if their affinity for the surface is not excessive. Owing to the differences in the affinities the various mobile phase compounds have for the stationary phase surface, each may experience longer or shorter retention times in the column. Through proper selection of such parameters as the materials used in the stationary phase, the solvents used in the mobile phase, the stationary phase accessible surface area, the column dimensions, and the temperature and pressure of the column, desired reaction products may be isolated from other compounds that may be present in the mobile phase.

One particularly useful method of liquid-solid chromatography is high pressure liquid chromatography (HPLC). HPLC makes use of elevated operating pressures (several hundred atmospheres, typically) and small particles as a stationary phase. One or more pumps are used to develop the elevated pressure required to overcome the increased pressure drop caused by the use of small particles in the column. Shortened retention times result from these changes, reducing the opportunity for the separated compounds to remix by diffusional processes prior to their exiting the column.

Another useful method of liquid-solid chromatography is flash chromatography. Flash chromatography is also known as medium-pressure chromatography. It typically uses intermediate pressures and particle sizes between those of HPLC and traditional gravity-fed atmospheric liquid-solid chromatography. Pressurized gases are typically used to develop the intermediate pressures used in this method.

Yet another useful method of liquid-solid chromatography is size-exclusion chromatography, also known as gel-permeation chromatography (GPC). GPC separates compounds based on their hydrodynamic volumes or molecular sizes. In this method, larger molecules have smaller retention times in the column. These retention times may be correlated to molecular weights using standards. A range of retention times will generally be observed for samples having a distribution of molecular weights. The breadth of a measured molecular weight distribution may be expressed in terms of its polydispersity index (PDI), which is the ratio of its weight-average molecular weight to its number-average molecular weight.

Suitable chromatographic separation methods are not limited to liquid-solid chromatography. More generally, the mobile phase may be a gas or a liquid and the stationary phase may be a solid or a liquid. In the case where the mobile and stationary phases are both liquids, the solvents in the two phases should be substantially immiscible. In such a case, the two liquids may flow in the same direction (co-current) or in opposite directions (counter-current) through the column.

Separation of very similar reaction products may require use of more than one type of separation to isolate the desired reaction products. Selection of methods and materials are techniques generally known to those skilled in the art.

Device Fabrication

Devices using the presently claimed inventions can be made using for example ITO as an anode material on a substrate. Other anode materials can include for example metals, such as Au, carbon nanotubes, single or multiwalled, and other transparent conducting oxides. The resistivity of the anode can be maintained below for example 15 Ω/sq or less, 25 or less, 50 or less, or 100 or less, or 200 or less, or 250 or less. The substrate can be for example glass, plastics (PTFE, polysiloxanes, thermoplastics, PET, PEN and the like), metals (Al, Au, Ag), metal foils, metal oxides, (TiOx, ZnOx) and semiconductors, such as Si. The ITO on the substrate can be cleaned using techniques known in the art prior to device layer deposition. An optional hole injection layer (HIL) can be added using for example spin casting, ink jetting, doctor blading, spray casting, dip coating, vapor depositing, or any other known deposition method. The HIL can be for example PEDOT, PEDOT/PSS or TBD, or NPB, or Plexcore HIL (Plextronics, Pittsburgh, Pa.).

The thickness of the HIL layer can be for example from about 10 nm to about 300 nm thick, or from 30 nm to 60 nm, 60 nm to 100 nm, or 100 nm to 200 nm. The film then can be optionally dried/annealed at 110 to 200° C. for 1 min to an hour, optionally in an inert atmosphere.

The active layer can be formulated from a mixture of n-type and p-type materials. The n- and p-type materials can be mixed in a ratio of for example from about 0.1 to 4.0 (p-type) to about 1 (n-type) based on a weight, or from about 1.1 to about 3.0 (p-type) to about 1 (n-type) or from about 1.1 to about 1.5 (p-type) to about 1 (n-type). The amount of each type of material or the ratio between the two types of components can be varied for the particular application.

The n- and p-type materials can be mixed in a solvent or in a solvent blend at for example from about 0.01 to about 0.1% volume solids. The solvents useful for the presently claimed inventions can include, for example, halogenated benzenes, alkyl benzenes, halogenated methane, and thiophenes derivatives, and the like. More specifically, solvent can be for example cholobenzene, dichlorobenzene, xylenes, toluene, chloroform, 3-methylthiophene, 3-propylthiphene, 3-hexylthiphene, and mixtures thereof. At least two solvents can be used.

Particularly useful solvent systems can be used as described in co-pending U.S. patent application entitled "Solvent System for Conjugated Polymers," Ser. No. 60/915,632 filed on May 2, 2007, to Sheina et al., which is hereby incorporated by reference in its entirety.

The active layer can be then deposited by spin casting, ink jetting, doctor blading, spray casting, dip coating, vapor depositing, or any other known deposition method, on top of the HIL film. The film is then optionally annealed at for example about 40 to about 250° C., or from about 150 to 180° C., for about 10 min to an hour in an inert atmosphere.

Next, a cathode layer can be added to the device, generally using for example thermal evaporation of one or more metals. For example, a 1 to 15 nm Ca layer is thermally evaporated onto the active layer through a shadow mask, followed by deposition of a 10 to 300 nm Al layer.

In some embodiments and optional interlayer may be included between the active layer and the cathode, and/or between the HTL and the active layer. This interlayer can be for example from 0.5 nm to about 100 nm, or from about 1 to 3 nm, thick. The interlayer can comprise an electron conditioning, a hole blocking, or an extraction material such as LiF, BCP, bathocuprine, fullerenes or fullerene derivatives, such as C60 and other fullerenes and fullerene derivatives discussed herein.

The devices can be then encapsulated using a glass cover slip sealed with a curable glue, or in other epoxy or plastic coatings. Cavity glass with a getter/dessicant may also be used.

In addition, the active layer can comprise additional ingredients including for example surfactants, dispersants, and oxygen and water scavengers.

The active layer can comprise multiple layers or be multi-layered.

The active layer composition can comprise a mixture in the form of a film.

Active Layer Morphology

The active layer can be a p-n composite and for example can form a heterojunction including a bulk heterojunction. See for example discussion of nanoscale phase separation in bulk heterojunctions in Dennler et al., "Flexible Conjugated Polymer-Based Plastic Solar Cells: From Basics to Applications," Proceedings of the IEEE, vol. 93, no. 8, August 2005, 1429-1439. Conditions and materials can be selected to provide for good film formation, low roughness (e.g., 1 nm RMS), and discrete, observable, phase separation characteristics can be achieved. The present invention can have phase separated domains on a scale of a about 5 to 50 nm as measured by AFM. AFM analysis can be used to measure surface roughness and phase behavior. In general, phase separated domains are not desirable so that both donor and acceptor are uniformly and continuously distributed in the active layer.

Device Performance

Known solar cell parameters can be measured including for example $J_{SC}$ (mA/cm$^2$) and Voc (V) and fill factor (FF) and power conversion efficiency (%, PCE) by methods known in the art. See for example Hoppe article cited above and references cited therein.

For example, the efficiency can be at least about 2%, or at least about 3%, or at least about 3.5%, or at least about 4%, or at least about 4.5%, or at least about 5.0%, or at least about 5.5%, or at least about 6.0%, or at least about 7.0%, or at least about 8.0%, or at least about 9.0%, or at least about 10.0% at 1 sun (AM1.5G, 100 mW/cm$^2$). An efficiency range can be for example about 2% to about 15%, or about 2% to about 10%, or about 2% to about 7%. These efficiencies can be verified by NREL.

The fill factor, for example, can be at least about 0.60, or at least about 0.63, or at least about 0.67, at least about 0.7, at least about 0.75, or at least about 0.8, at least about 0.85.

The Voc (V), for example, can be at least about 0.56, or at least about 0.63, or at least about 0.82, at least about 0.9, at least about 1.0, at least about 1.2, at least about 1.4, at least about 1.5.

The Jsc (mA/cm$^2$), for example, can be at least about 8.92, or at least about 9.20, or at least about 9.48, or at least about 10, or at least about 11, or at least about 12, or at least about 13, or at least about 14, or at least about 15.

The device can demonstrate an increase of efficiency of at least 5%, or at least 15%, compared to a substantially analogous device comprising an active layer of P3HT-PCBM.

Figure 2:
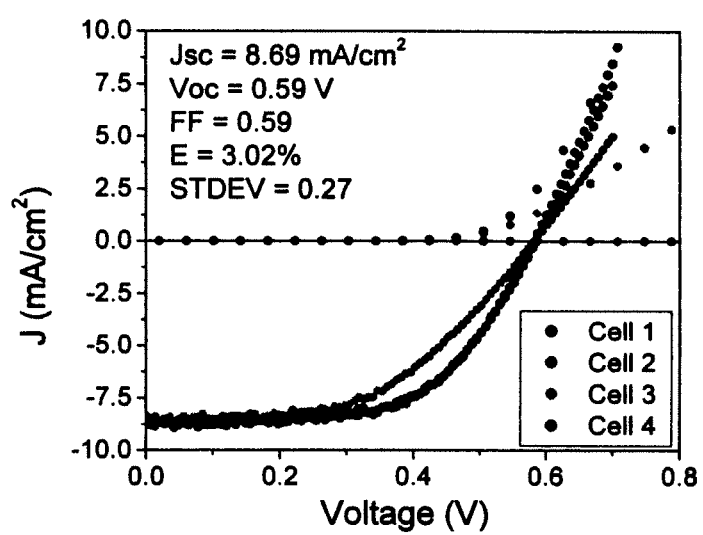
FIG. 2 shows improved performance with C70PCBM versus C60PCBM.
Figure 3:
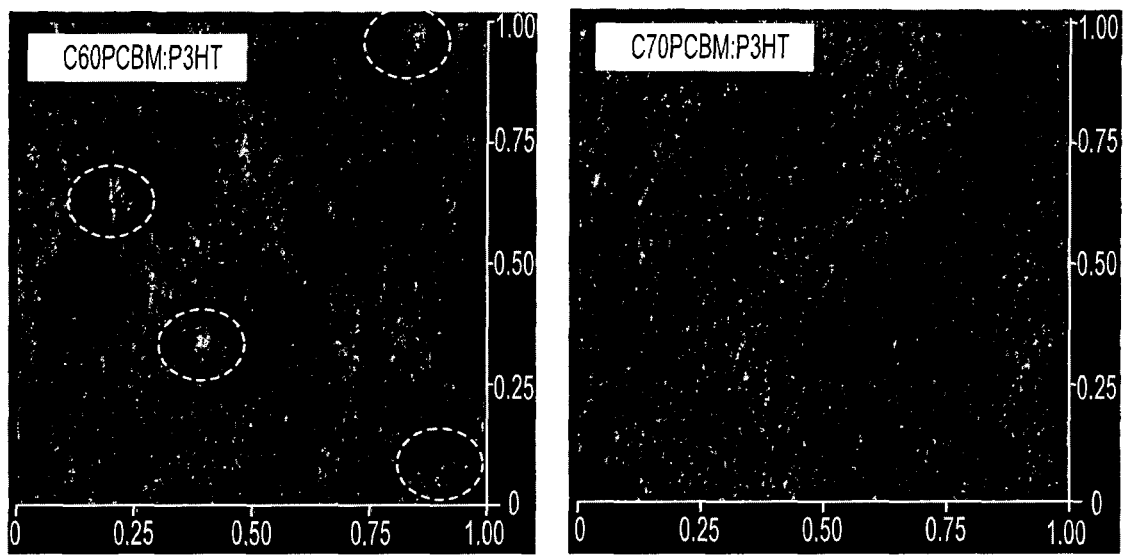
FIG. 3 provides AFM images for C60PCBM:P3HT versus C70PCBM:P3HT prepared in dichlorobenzene. Circles denote phase separation in C60PCBM system—these domains are absent in C70PCBM active layer.

FIG. 2 illustrates improved performance, wherein efficiency is raised to 3% rather than 2% for control devices (at least 20% improvement). The improvement in efficiency is consistent with the significant extension to higher wavelengths of the absorption spectrum for C70PCBM and the resulting blend with p-type material compared to that of C60PCBM-based films. Additional comparative data are provided in FIG. 3 showing better film morphology.

Oriel Solar Simulators can be used to determine PV properties including for example FF, Jsc, Voc, and efficiencies. The simulator can be calibrated by methods known in the art including for example calibration with a KG5-Si reference cell.

Literature

The following references can be also used as needed to practice the various embodiments described herein and are incorporated herein by reference:

REFERENCES CITED

Anvar, et al., High Efficiency P3HT/PCBM Solar Cell *Mater. Res. Symp. Proc.,* 2005, 836, 69-80

Birkett, P. R.; Avent, A. G.; Darwish, A. D.; Kroto, H. W.; Taylor, R.; Walton, D. R. M. Preparation and $^{13}$C NMR Spectroscopic Characterization of $C_{60}Cl_6$. *J. Chem. Soc., Chem. Commun.* 1993, 1230-1232. Carroll, et al., *App. Phys. Let.,* 2005, 87, 083506; *Organic Letters,* 2005, 7, 574

Cioslowski, J.; Rao, N.; Moncrieff, D. Standard Enthalpies of Formation of Fullerenes and Their Dependence on Structural Motifs. *J. Am. Chem. Soc.* 2000, 122, 8265-8270.

Diener, M. D., Nichelson, N. and Alford, J. M. Synthesis of Single-Walled Carbon Nanotubes in Flames. *J. Phys. Chem. B* 2000, 104, 9615-9620.

Dresselhaus, M. S., Dresselhaus, G. and Eklund, P. C., Science of Fullerenes and Carbon Nanotubes. Academic Press, 1996, pp. 870-917.

Height, M. J.; Howard, J. B.; Vander Sande, J. B. Method and Apparatus for Synthesizing Filamentary Structures. U.S. patent application Ser. No. 10/389,002 (U.S. Serial No.), 2003.

Height, M. J., Howard, J. B., Tester, J. W., and Vander Sande, J. B. Flame Synthesis of Single-Walled Carbon Nanotubes. *Carbon* 42 (2004) 2295-2307.

Height, M. J., Howard, J. B., and Tester, J. W., Flame Synthesis of Single-walled Carbon Nanotubes. *Proc. Combust. Inst.* 2005, 30, 2537-2543.

Hirsch, A.; Brettreich, M. Fullerenes: Chemistry and Reactions. Wiley-VCH Verlag, Weinheim, 2005.

Howard, J. B.; McKinnon, J. T.; Makarovsky, Y.; Lafleur, A. L.; Johnson, M. E. Fullerenes $C_{60}$ and $C_{70}$ in Flames. *Nature* 1991, 352, 139-141.

Howard, J. B.; McKinnon, J. T.; Johnson, M. E.; Makarovsky, Y.; Lafleur, A. L. Production of $C_{60}$ and $C_{70}$ fullerenes in benzene-oxygen flames. *J. Phys. Chem.* 1992a, 96, 6657-6662.

Howard, J. B.; Lafleur, A. L.; Makarovsky, Y.; Mitra, S.; Pope, C. J.; Yadav, T. K. Fullerenes Synthesis in Combustion. *Carbon* 1992b, 30, 1183-1201.

Howard, J. B. Fullerenes Formation in Flames. *Proc. Combust. Inst.* 1992, 24, 933-946.

Howard, J. B.; McKinnon, J. T. Combustion method for producing fullerenes. U.S. Pat. No. 5,273,729 (1993).

Howard, J. B., Chowdhury, K. D. and Vander Sande, J. B., Carbon Shells in Flames. *Nature* 1994, 370, 603.

Howard, J. B.; Vander Sande, J. B.; Chowdhury, K. Das Production of fullerenic nanostructures in flames. U.S. Pat. No. 5,985,232 (1999).

Howard, J. B.; Vander Sande, J. B.; Chowdhury, K. Das Production of fullerenic soot in flames. U.S. Pat. No. 6,162,411 (2000).

Howard, J. B.; Kronholm, D. F.; Modestino, A. J.; Richter, H. Method for Combustion Synthesis of Fullerenes. Patent Application PCT/US02/27838, submitted on Aug. 31, 2002.

Hummelen, J. C.; Knight, B. W.; LePeq, F.; Wudl, F. Preparation and Characterization of Fulleroid and Methanofullerene Derivatives. *J. Org. Chem.* 1995, 60, 532-538.

Kadish, K. M.; Ruoff, R. S. (ed.) Fullerenes: Chemistry, Physics and Technology. Wiley-Interscience, New York, 2000

Kitagawa, T.; Sakamoto, H.; Takeuchi, K. Electrophilic Addition of Polychloroalkanes to $C_{60}$: Direct Observation of Alkylfullerenyl Cation Intermediates. *J. Am. Chem. Soc.* 1999, 121, 4298-4299.

Koster, L. J. A.; Mihailetchi, V. D.; Blom, P. W. M. Ultimate Efficiency of Polymer/Fullerene Bulk Heterojunction Solar Cells. *Appl. Phys. Lett.* 2006, 88, 093511

Krätschmer, W.; Lamb, L. D.; Fostiropoulos, K.; and Huffman, D. R. Solid $C_{60}$: A New Form of Carbon. *Nature* 1990, 347, 354-358.

Lamparth, I.; Hirsch, A. Water-soluble Malonic Acid Derivatives of $C_{60}$ with a Defined Three-dimensional Structure. has been demonstrated successfully. *J. Chem. Soc., Chem. Commun.* 1994, 1727-1728.

McCullough, R. D.; Tristram-Nagle, S.; Williams, S. P.; Lowe, R. D.; Jayaraman, M. *J. Am. Chem. Soc.* 1993, 115, 4910

Perlin, John "The Silicon Solar Cell Turns 50" *NREL* 2004

Puplovskis, A.; Kacens, J.; Neilands, O. New Route for [60] Fullerene Functionalization in [4+2] Cycloaddition Reaction Using Indene. *Tetrahedron Lett.* 1997, 38, 285-288.

Richter, H.; Fonseca, A.; Emberson, S. C.; Gilles, J.-M.; B. Nagy, J.; Thiry, P. A.; Caudano, R.; Lucas, A. A. Fabrication of Fullerenes in Benzene/Oxygen/Argon- and Benzene/Acetylene/Oxygen/Argon Flames. *J. Chim. Phys.* 1995a, 92, 1272-1285.

Richter, H.; Fonseca, A.; Thiry, P. A.; Gilles, J.-M.; B. Nagy, J.; Lucas, A. A. Combustion Synthesis of Fullerenes. *Mat. Res. Soc. Symp. Proc.* 1995b, 359, 17-22.

Richter, H.; Hernadi, K.; Caudano, R.; Fonseca, A.; Migeon, H.-N.; B. Nagy, J.; Schneider, S.; Vandooren, J.; Van Tiggelen, P. J. Formation of Nanotubes in Low-pressure Hydrocarbon Flames. *Carbon* 1996a, 34, 427-429.

Richter, H.; Fonseca, A.; Gilles, J.-M.; B. Nagy, J.; Thiry, P. A.; Lucas, A. A.; de Hoffmann, E. Addition of HCl, $Cl_2$, $CoCl_2$ and KI to Fullerene forming Benzene/oxygen/argon Flames. *Synthetic Metals* 1996b, 77, 217-221.

Richter, H.; Labrocca, A. J.; Grieco, W. J.; Taghizadeh, K.; Lafleur, A. L.; Howard, J. B. Generation of Higher Fullerenes in Flames. *J. Phys. Chem. B* 1997, 101, 1556-1560.

Richter, H.; Grieco, W. J.; Howard, J. B. Formation Mechanism of Polycyclic Aromatic Hydrocarbons and Fullerenes in Premixed Benzene Flames. *Combust. Flame* 1999, 119, 1-22.

Richter, H.; Benish, T. G.; Mazyar, O. A.; Green, W. H.; Howard, J. B. Formation of Polycyclic Aromatic Hydrocarbons and their Radicals in a Nearly Sooting Premixed Benzene Flame. *Proc. Combust. Inst.* 2000, 28, 2609-2618.

Richter, H.; Howard, J. B. Formation and Consumption of Single-Ring Aromatic Hydrocarbons and their Precursors in Premixed Acetylene, Ethylene and Benzene Flames. *Phys. Chem. Chem. Phys.* 2002, 4, 2038-2055.

Richter, H.; Granata, S.; Green, W. H.; Howard, J. B. Detailed Modeling of PAH and Soot Formation in a Laminar Premixed Benzene/Oxygen/Argon Low-Pressure Flame. *Proc. Combust. Inst.* 2005b, 30, 1397-1405.

Richter, H.; Howard, J. B.; Vander Sande, J. B. From Academic Soot Research to Commercial Synthesis of Single-walled Carbon Nanotubes. AICHE Fall Meeting, Cincinnati, November 2005a.

Richter, H.; Howard, J. B.; Vander Sande, J. B., Industrial Production of Fullerenic Materials. *Prepr. Pap.—Am. Chem. Soc., Div. Fuel Chem.* 2006, 51(1), 92.

Ruoff, R. S.; Tse, D. S.; Malhotra, R.; Lorents, D. C. Solubility of C60 in a Variety of Solvents. *J. Phys. Chem.* 1993, 97, 3379-3383.

Tebbe, F. N.; Harlow, R. L.; Chase, D. B.; Thorn, D. L.; Campbell, Jr., G. C.; Calabrese, J. C.; Herron, N.; Young, Jr., R. J.; Wasserman, E. Synthesis and Single-Crystal X-ray Structure of a Highly Symmetrical $C_{60}$ Derivative, $C_{60}Br_{24}$. *Science* 1992, 256, 822-825.

Wienk, M. M.; Kroon, J. M.; Verhees, W. J. H.; Knol, J.; Hummelen, J. C.; van Hal, P. A.; Janssen, R. A. J.; Efficient Methano[70]fullerene/MDMO-PPV Bulk Heterojunction Photovoltaic Cells. *Angew. Chem. Int. Ed.* 2003, 42, 3371-3375.

Yang, et al., *Nature of Materials*, 2005, 4, 864-868

Yu, J.; Sumathi, R.; Green, W. H. Accurate and Efficient Method for Predicting Thermochemistry of Polycyclic Aromatic Hydrocarbons—Bond Centered Group Additivity. *J. Am. Chem. Soc.* 2004, 126, 12685-12700.

Sixteen Embodiments from First Provisional Application

Sixteen additional embodiments are provided as described in U.S. provisional application Ser. No. 60/812,961 filed Jun. 13, 2006 to Laird et al., which is incorporated by reference in its entirety.

A first embodiment comprises a photovoltaic device comprising: a first electrode, a second electrode, at least one active layer disposed between the first and second electrodes, wherein the active layer comprises at least one polythiophene and at least one fullerene derivative comprising an electron withdrawing group.

A second embodiment comprises the device according to the first embodiment, wherein the fullerene derivative is a C60 fullerene.

A third embodiment comprises the device according to the first embodiment, wherein the fullerene derivative is a C70 fullerene.

A fourth embodiment comprises the device according to the first embodiment, wherein the fullerene derivative is a C84 fullerene.

A fifth embodiment comprises the device according to the first embodiment, wherein the fullerene derivative comprises C60Cl6, C60(C9H8), C60Br24, C60Cl(CH2ClChCl2)

A sixth embodiment comprises the device according to the first embodiment, wherein the polythiophene is a regioregular polythiophene.

A seventh embodiment comprises the device according to the first embodiment, wherein the polythiophene is a copolymer.

An eighth embodiment comprises the device according to the first embodiment, further comprising an HIL or HTL layer.

A ninth embodiment comprises the device according to the first embodiment, wherein the polythiophene is a soluble regioregular polythiophene.

A tenth embodiment comprises the device according to the first embodiment, wherein the electron withdrawing group also generates absorption in the visible spectrum.

An eleventh embodiment comprises a photovoltaic device comprising: a first electrode, a second electrode, an least one active layer disposed between the first and second electrodes, wherein the active layer comprises at least one polythiophene and at least one fullerene derivative, wherein the fullerene derivative is a C70 or C84 fullerene.

A twelfth embodiment comprises a photovoltaic device comprising: a first electrode, a second electrode, an least one active layer disposed between the first and second electrodes, wherein the active layer comprises at least one polythiophene and at least one fullerene derivative, wherein the fullerene derivative is a C70 fullerene.

A thirteenth embodiment comprises a photovoltaic device comprising: a first electrode, a second electrode, an least one active layer disposed between the first and second electrodes, wherein the active layer comprises at least one polythiophene and at least one fullerene derivative, wherein the fullerene derivative is a C84 fullerene.

A fourteenth embodiment comprises a photovoltaic device comprising: a first electrode, a second electrode, an least one active layer disposed between the first and second electrodes, wherein the active layer comprises at least one polythiophene and underivatized C70 fullerene.

A fifteenth embodiment comprises a photovoltaic device comprising: a first electrode, a second electrode, an least one active layer disposed between the first and second electrodes, wherein the active layer comprises at least one polythiophene and underivatized C84 fullerene.

A sixteenth embodiment comprises a photovoltaic device comprising: a first electrode, a second electrode, an least one active layer disposed between the first and second electrodes, wherein the active layer comprises at least one polythiophene and at least one fullerene derivative comprising o-quinodimethane derivative group.

Seventy-Six Embodiments from Second Provisional Application

Seventy-six additional embodiments are provided as described in U.S. provisional application Ser. No. 61/016,420 filed Dec. 21, 2007 to Laird et al., which is incorporated by reference in its entirety.

A first embodiment comprises a composition comprising a mixture comprising: (i) at least one p-type material, (ii) at least one n-type material, wherein the n-type material comprises a fullerene derivative represented by: $F^*\text{-}(R)_n$ and solvates, salts, and mixtures thereof, wherein n is at least one, $F^*$ comprises a fullerene having a surface which comprises six-membered and five-membered rings; and R comprises at least one optionally substituted, unsaturated or saturated, carbocyclic or heterocyclic first ring, wherein the first ring directly bonds to the fullerene.

A second embodiment comprises the composition according to the first embodiment, wherein the first ring is substituted.

A third embodiment comprises the composition according to the first embodiment, wherein the first ring is not substituted.

A fourth embodiment comprises the composition according to the first embodiment, wherein the first ring is an unsaturated ring.

A fifth embodiment comprises the composition according to the first embodiment, wherein the first ring is a saturated ring.

A sixth embodiment comprises the composition according to the first embodiment, wherein the first ring is a carbocyclic ring.

A seventh embodiment comprises the composition according to the first embodiment, wherein the first ring is a heterocyclic ring.

An eighth embodiment comprises the composition according to the first embodiment, wherein the first ring is an optionally substituted four-membered, five-membered, or six-membered ring.

A ninth embodiment comprises the composition according to the first embodiment, wherein the ring is an optionally substituted five-membered ring.

A tenth embodiment comprises the composition according to the first embodiment, wherein R further comprises a second ring which is bonded to or fused with the first ring.

An eleventh embodiment comprises the composition according to the first embodiment, wherein R further comprises an optionally substituted second ring which is fused to the first ring.

A twelfth embodiment comprises the composition according to the first embodiment, wherein R further comprises an optionally substituted second ring which is an aryl group and is fused to the first ring.

A thirteenth embodiment comprises the composition according to the first embodiment, wherein R is optionally substituted indene, optionally substituted naphthyl, optionally substituted phenyl, optionally substituted pyridinyl, optionally substituted quinolinyl, optionally substituted cyclohexyl, or optionally substituted cyclopentyl.

A fourteenth embodiment comprises the composition according to the first embodiment, wherein R is indene, napthyl, phenyl, pyridinyl, quinolinyl, cyclohexyl, or cyclopentyl.

A fifteenth embodiment comprises the composition according to the first embodiment, wherein R is optionally substituted indene.

A sixteenth embodiment comprises the composition according to the first embodiment, wherein R is indene.

A seventeenth embodiment comprises the composition according to the first embodiment, wherein n is from 1 to 6.

An eighteenth embodiment comprises the composition according to the first embodiment, wherein n is from 1 to 3.

A nineteenth embodiment comprises the composition according to the first embodiment, wherein R is indene and n is 1.

A twentieth embodiment comprises the composition according to the first embodiment, wherein R is indene and n is 2.

A twenty-first embodiment comprises the composition according to the first embodiment, wherein R is indene and n is 3.

A twenty-second embodiment comprises the composition according to the first embodiment, wherein R is indene, n is from 1 to 20.

A twenty-third embodiment comprises the composition according to the first embodiment, wherein R is indene, n is from 1 to 10.

A twenty-fourth embodiment comprises the composition according to the first embodiment, wherein the first ring is optionally substituted with at least one substituent selected from the group consisting of hydroxy, acyl, acylamino, acyloxy, alkyl, substituted alkyl, alkoxy, substituted alkoxy, alkenyl, substituted alkenyl, alkynyl, substituted alkynyl, amino, substituted amino, aminoacyl, aryl, substituted aryl, aryloxy, substituted aryloxy, cycloalkoxy, substituted cycloalkoxy, carboxyl, carboxyl esters, cyano, thiol, thioalkyl, substituted thioalkyl, thioaryl, substituted thioaryl, thioheteroaryl, substituted thioheteroaryl, thiocycloalkyl, substituted thiocycloalkyl, thioheterocyclic, substituted thioheterocyclic, cycloalkyl, substituted cycloalkyl, halo, nitro, heteroaryl, substituted heteroaryl, heterocyclic, substituted heterocyclic, heteroaryloxy, substituted heteroaryloxy, heterocyclyloxy, or substituted heterocyclyloxy, or combination thereof.

A twenty-fifth embodiment comprises the composition according to the first embodiment, wherein R is covalently bonded to the fullerene by [4+2] cycloaddition.

A twenty-sixth embodiment comprises the composition according to the first embodiment, wherein R is covalently bonded to the fullerene by one or two covalent bonds.

A twenty-seventh embodiment comprises the composition according to the first embodiment, wherein R is covalently bonded to the fullerene by two bonds.

A twenty-eighth embodiment comprises the composition according to the first embodiment, wherein R is covalently bonded to the fullerene by two carbon-carbon bonds.

A twenty-ninth embodiment comprises the composition according to the first embodiment, wherein R is covalently bonded to the fullerene by two carbon-carbon bonds at a fullerene [6,6] position.

A thirtieth embodiment comprises the composition according to the first embodiment, wherein the fullerene comprises a C60, C70, or C84 fullerene, or a combination thereof.

A thirty-first embodiment comprises the composition according to the first embodiment, wherein the fullerene comprises only carbon.

A thirty-second embodiment comprises the composition according to the first embodiment, wherein the fullerene comprises at least one derivative group bonded to the fullerene besides R.

A thirty-third embodiment comprises the composition according to the first embodiment, wherein the p-type material comprises a conjugated polymer.

A thirty-fourth embodiment comprises the composition according to the first embodiment, wherein the p-type material comprises a conjugated polymer soluble or dispersible in organic solvent or water.

A thirty-fifth embodiment comprises the composition according to the first embodiment, wherein the p-type material comprises a polythiophene.

A thirty-sixth embodiment comprises the composition according to the first embodiment, wherein the p-type material comprises a regioregular polythiophene.

A thirty-seventh embodiment comprises the composition according to first embodiment, wherein the n-type and p-type materials are present in a ratio of from about 0.1 to 4.0 p-type to about 1 n-type, based on weight.

A thirty-eighth embodiment comprises the composition according to the first embodiment, wherein the p-type material comprises polythiophene and the R group is optionally substituted indene, and the composition is in the form of a film having a film thickness of about 10 nm to about 300 nm.

A thirty-ninth embodiment comprises the composition according to the first embodiment, wherein the p-type material comprises regioregular polythiophene and the R group is indene.

A fortieth embodiment comprises the composition according to the first embodiment, wherein the p-type material comprises regioregular polythiophene and the R group is indene and the composition further comprises at least two solvents.

A forty-first embodiment comprises a composition comprising a mixture comprising: (i) at least one p-type material, (ii) at least one n-type material, wherein the n-type material comprises at least one fullerene derivative comprising at least one [6,6] fullerene bonding site wherein both carbon atoms of the [6,6] bonding site are covalently bonded to a group R.

A forty-second embodiment comprises the composition according to the forty-first embodiment, wherein the group R comprises a first ring bonded directly to the [6,6] fullerene bonding site.

A forty-third embodiment comprises the composition according to the forty-first embodiment, wherein the group R comprises a first ring bonded directly to the [6,6] fullerene bonding site and a second ring fused to the first ring.

A forty-fourth embodiment comprises the composition according to the forty-first embodiment, wherein the group R comprises a first five-membered carbocyclic ring bonded directly to the [6,6] fullerene bonding site and a second six-membered carbocyclic ring fused to the first ring.

A forty-fifth embodiment comprises the composition according to the forty-first embodiment, wherein the group R comprises optionally substituted indene.

A forty-sixth embodiment comprises the composition according to the forty-first embodiment, wherein the group R comprises indene.

A forty-seventh embodiment comprises the composition according to the forty-first embodiment, wherein the p-type material comprises a conjugated polymer.

A forty-eighth embodiment comprises the composition according to the forty-first embodiment, wherein the p-type material comprises a polythiophene.

A forty-ninth embodiment comprises the composition according to the forty-first embodiment, wherein the p-type material comprises a regioregular polythiophene.

A fiftieth embodiment comprises the composition according to the forty-first embodiment, wherein the p-type material comprises a regioregular polythiophene and the group R is optionally substituted indene.

A fifty-first embodiment comprises a composition comprising a mixture comprising: (i) at least one p-type material, (ii) at least one n-type material, wherein the n-type material comprises a fullerene derivative comprising at least one fullerene covalently bonded by [4+2] cycloaddition to at least one derivative moiety.

A fifty-second embodiment comprises the composition according to the fifty-first embodiment, wherein the derivative moiety comprises a first ring bonded directly to the fullerene.

A fifty-third embodiment comprises the composition according to the fifty-first embodiment, wherein the derivative moiety comprises a first ring bonded directly to the fullerene and a second ring fused to the first ring.

A fifty-fourth embodiment comprises the composition according to the fifty-first embodiment, wherein the derivative moiety comprises a first five-membered carbocyclic ring bonded directly to the fullerene bonding site and a second six-membered carbocyclic ring fused to the first ring.

A fifty-fifth embodiment comprises the composition according to the fifty-first embodiment, wherein the derivative moiety comprises optionally substituted indene.

A fifty-sixth embodiment comprises the composition according to the fifty-first embodiment, wherein the derivative moiety comprises indene.

A fifty-seventh embodiment comprises the composition according to the fifty-first embodiment, wherein the p-type material comprises a conjugated polymer.

A fifty-eighth embodiment comprises the composition according to the fifty-first embodiment, wherein the p-type material comprises a polythiophene.

A fifty-ninth embodiment comprises the composition according to the fifty-first embodiment, wherein the p-type material comprises a regioregular polythiophene.

A sixtieth embodiment comprises the composition according to the fifty-first embodiment, wherein the p-type material comprises a regioregular polythiophene and the derivative moiety is optionally substituted indene.

A sixty-first embodiment comprises a photovoltaic device comprising at least one anode, at least one cathode, and at least one active layer, wherein the active layer comprises a composition comprising a mixture comprising: (i) at least one p-type material, (ii) at least one n-type material, wherein the n-type material comprises a fullerene derivative represented by: $F^*-(R)_n$ and solvates, salts, and mixtures thereof, wherein n is at least one, $F^*$ comprises a fullerene having a surface which comprises six-membered and five-membered rings; and R comprises at least one optionally substituted, unsaturated or saturated, carbocyclic or heterocyclic first ring, wherein the first ring directly bonds to the fullerene.

A sixty-second embodiment comprises the device according to the sixty-first embodiment, wherein the device demonstrates an increase of efficiency of at least 5% compared to a substantially analogous device comprising an active layer of P3HT-PCBM.

A sixty-third embodiment comprises the device according to the sixty-first embodiment, wherein the device demonstrates an increase of efficiency of at least 15% compared to a substantially analogous device comprising an active layer of P3HT-PCBM.

A sixty-fourth embodiment comprises the device according to the sixty-first embodiment, wherein the device further comprises at least one hole injection layer.

A sixty-fifth embodiment comprises the device according to the sixty-first embodiment, wherein the device further comprises at least one hole injection layer comprising a polythiophene.

A sixty-sixth embodiment comprises the device according to the sixty-first embodiment, wherein the device further comprises at least one hole injection layer comprising a regioregular polythiophene.

A sixty-seventh embodiment comprises the device according to the sixty-first embodiment, wherein the R group comprises an optionally substituted indene group.

A sixty-eighty embodiment comprises the device according to the sixty-first embodiment, wherein the R group comprises an indene group.

A sixty-ninth embodiment comprises the device according to the sixty-first embodiment, wherein the R group comprises an optionally substituted indene group, the p-type material comprises at least one regioregular polythiophene.

A seventieth embodiment comprises the device according to the sixty-first embodiment, wherein the R group comprises an optionally substituted indene group, the p-type material comprises at least one regioregular polythiophene, and the device further comprises a hole injection layer comprising a regioregular polythiophene.

A seventy-first embodiment comprises a method of making a composition comprising a mixture comprising: (i) providing at least one p-type material, (ii) providing at least one n-type material, wherein the n-type material comprises a fullerene derivative represented by: $F^*-(R)_n$ and solvates, salts, and mixtures thereof, wherein n is at least one, $F^*$ comprises a fullerene having a surface which comprises six-membered and five-membered rings; and R comprises at least one optionally substituted, unsaturated or saturated, carbocyclic or heterocyclic first ring, wherein the first ring directly bonds to the fullerene, (iii) combining the p-type and n-type materials to form the mixture, wherein the mixture further comprises at least one solvent.

A seventy-second embodiment comprises the method according to seventy-first embodiment, wherein the mixture comprises at least two solvents.

A seventy-third embodiment comprises the method according to the seventy-first embodiment, further comprising removing solvent and forming the mixture into a film.

A seventy-fourth embodiment comprises the mixture according to the seventy-first embodiment, wherein R comprises optionally substituted indene.

A seventy-fifth embodiment comprises the mixture according to the seventy-first embodiment, wherein R comprises indene.

A seventy-sixth embodiment comprises photovoltaic cells comprising an active layer comprising, as p-type material, conjugated polymers such as polythiophene and regioregular polythiophene, and as n-type material at least one fullerene derivative, wherein the fullerene derivative can be C60, C70, or C84, and wherein the fullerene also can be functionalized with indene groups, whereby improved efficiency can be achieved.

Improved Methods

The above embodiments can be further subjected to improved methods of fullerene derivative production.

One embodiment provides for a method comprising: reacting at least one fullerene with indene, at least one substituted indene, or a combination thereof in substantial absence of any solvent in addition to indene or the substituted indene.

The methods include the step of executing the chemical reaction, the step of working up the reaction, and the step of purifying the different reaction products from each other by, for example, chromatography. For example, a mono adduct can be formed, a bisadduct can be formed, a tris adduct can be formed, a tetra-adduct can be formed, a penta adduct can be formed, and a hexaadduct can be formed, and the like including higher order adducts. Mixtures of these adducts can be formed. In many cases, one of the adducts can be identified as the primary reaction product based on the largest reaction yield. The mixtures can be separated with for example chromatography. In a first separation step, the separation can be based on the number of derivative groups per fullerene molecule. In an additional separation step, if desired, different isomers of the same derivative (e.g., tris-substituted derivative) can be separated.

As described above, a variety of fullerenes can be used. For example, as described above, the fullerene can be for example a C60 or a C70 fullerene. The derivatives described above can be used including in particular the indene and the substituted indene derivatives.

Reaction conditions can be adapted to push the reaction to higher orders of derivatization, e.g, tris, tetra, penta, and hexa rather than mere mono or bis.

For example, as described above, the reacting can result in a reaction product comprising a mixture of derivatized fullerene such as indene-fullerene derivatives or reaction products, wherein the primary reaction product can be, for example, a tris- or tetra-substituted indene-fullerene reaction. Each of these derivatives can comprise a plurality of isomers as known in the art.

The derivative compound such as for example indene or substituted indene can function as a solvent at least to some extent. In some embodiments, substantially no additional solvent can be used so that the only solvent is substantially the derivative compound such as for example indene or substituted indene. The amount of additional solvent can be for example less than about 20 wt. %, or less than about 5 wt. % with respect to the amount of the derivative compound such as indene or substituted indene.

The reaction time can be for example about 48 h or less, or about 24 h or less. It can be for example, about 6 h to about 48 h, or about 12 h to about 24 h.

A molar excess of derivative compound such as indene or substituted indene can be used in the reaction with fullerene. Excess can be measured as the molar amount of derivative compound with respect to the molar amount of fullerene in a ratio. For example, excess indene or substituted indene can be used. For example, the excess can be at least about 100, or at least about 300, or at least about 500, or at least about 600. Sufficient derivative compound such as indene or substituted indene can be used so that the fullerene is fully soluble. In terms of mg of fullerene to mL of derivative compound such as indene or substituted indene, the amount can be for example at least about 10 mg/mL.

The reaction temperature can be for example at least about 150° C., or at least about 180° C.

The reaction pressure can be for example at least about one atmosphere, or at least about 1.2 atmospheres, or at least about 2 atmospheres, or at least about 5 atmospheres.

The most abundant reaction product can be present in at least about 40 wt. %, or at least about 50%, or at least about 60%, with respect to the total amount of unreacted fullerene and fullerene reaction product. Known instrumentation methods of separation, like chromatography, and associated software can be used to measure these relative amounts.

In reaction workup, methods known in the art for fullerene isolations can be used. For example, the reaction mixture can be adjusted to a controlled temperature such as room temperature and cooled down from the reaction temperature. Solvent such as alcohols like methanol or ethanol can be added to precipitate the fullerene derivative. The solids can be separated from the liquids by for example filtration. The solids can be rinsed and dried. The solids can be subjected to further analysis such as chromatography and individual components can be separated by methods known in the art.

The method also provides for reacting derivative compound such as indene, substituted indene, or a combination thereof with a fullerene under reaction conditions wherein the most abundant reaction product is a tris-derivative or a tetra-derivative. For example, reaction conditions which can be adapted can be for example temperature, pressure, amount of derivative compound such as indene or substituted indene, and reaction time. Solvent can be substantially eliminated.

In one embodiment, the fullerene can be derivatived in a first step. Then a product can be isolated such as for example a mono-adduct, a bis-adduct, or a tris-adduct. The reaction mixture can be then subjected to a new reaction and continued as a new reaction. For example, another fullerene derivatization reaction can be carried out.

Mixtures of fullerenes can be subjected to derivatization reaction. For example, a mixture of C60 and C70 can be used. Or an extract of an as-produced product can be taken from a fullerene reactor and can be used.

The fullerene which is subjected to a derivatization reaction can be itself a derivatized fullerene such as for example a fullerene compound with one, two, three, four, or more derivative groups on it such as for example PCBM.

In the derivatization reaction of the fullerene, one or more additives can be included to improve the reaction. For example, acid or base can be added. One or more metals can be added. An additive can help prevent polymerization of for example indene or substituted indene.

Through derivation reactions, two or more fullerenes may be tethered intermolecularly. For example, fullerenes may first be derivatized by reaction with indene, the reaction product of which may be subsequently reacted with additional fullerenes to produce intermolecularly tethered products. In another example, fullerenes may first be derivatized by reaction with some compound other than indene, the reaction product of which may be reacted with indene, and optionally other fullerenes or fullerene derivatives, to produce intermolecularly tethered products. In either case, the intermolecularly tethered product may optionally undergo subsequent derivatization by reaction with another compound.

Alternatively, intramolecular tethering via derivation reactions may occur. For example, fullerenes may first be derivatized with indene, with reactive groups on the same fullerene subsequently reacting with each other to form one or more intramolecular tethers. In another example, fullerenes may first be derivatized by reaction with some compound other than indene, the reaction product of which may be reacted with indene, to form one or more intramolecular tethers. In either case, the intermolecularly tethered product may optionally undergo subsequent derivatization by reaction with another compound.

WORKING EXAMPLES

Various claimed embodiments are described further with use of non-limiting working examples.

Example 1

Synthesis of $C_{60}$-indene Adducts $C_{60}$ indene adducts have been synthesized using the description in reference (Puplovskis, et al., "New Route for [60]Fullerene Functionalization in [4+2] Cycloaddition Reaction Using Indene." *Tetrahedron Lett.* 1997, 38, 285-288) as starting point. $C_{60}$ was dissolved in o-dichlorobenzene at concentrations of approximately 6 mg mL$^{-1}$. Indene was added at 12-fold molar excess relative to $C_{60}$ and the resulting mixture was refluxed overnight. Most of the solvent was evaporated under reduced pressure and precipitation occurred after adding ethanol. The resulting solid was dried, re-dissolved in toluene and then analyzed by means of high-pressure liquid chromatography using a Cosmosil Buckyprep analytical column (250×4.6 mm, Nacalai Tesque, Inc.) mounted on an Agilent 1100 series instrument equipped with a variable wavelength detector operated at 330 nm. Toluene at a flow rate of 1 ml min$^{-1}$ was used for elution. Peaks at an elution time of approximately 5.4 min and a group of peak around 4 min were attributed to $C_{60}$-indene mono- and bis-adducts, respectively. The presence of several peaks with very close elution times around 4 min is consistent with the presence of several isomers. Elution times shorter than that of unfunctionalized C60 (about 8.1 min) have been observed previously with other fullerene derivatives such as $C_{60}$PCBM. Multiple additions were found to lead to a further decrease of elution times. A pentabromobenzyl-functionalized silica phase was used for purification by means of flash chromatography. Pure toluene and toluene/cyclo-hexane mixtures were used for purification. HPLC analysis of the collected fractions showed purities 98.5% for the $C_{60}$-indene monoadduct and approximately 95% for the mixture of different bis-adducts.

Example 2

Synthesis of $C_{70}$-indene Monoadduct

C70-indene mono-adduct was synthesized following the procedure developed for the C60-indene adducts. $C_{70}$ was dissolved in o-dichlorobenzene. After addition of indene in a 12-fold molar excess, reflux was maintained for 8 h. After reduction of the volume under reduced pressure and addition of ethanol, solid was recovered, dried and re-dissolved in toluene. HPLC analysis using the same procedure as described above showed the presence of mainly mono-adduct, probably due to the reaction time, reduced in comparison to the $C_{60}$-adduct synthesis. Purification using flash chromatography led to the isolation of $C_{70}$-monoadduct at a purity of 98.6%. The corresponding HPLC chromatogram is given below. Two major isomers representing different addition sites on the $C_{70}$ cage have been identified.

Example 3

Synthesis of $C_{60}(C_9H_8)_3$

Procedure A:
5 g of $C_{60}$ has been dissolved in 500 mL of o-dichlorobenzene using a 1 L flat-bottom three neck flask. 26-fold excess of indene has been added and the mixture refluxed for 65 hours in an inert gas (argon) atmosphere. After cooling down, a five-fold excess of methanol was added, the product mixture precipitated and recovered by filtration using 1 µm pore size filter paper. After rinsing with methanol and drying on a hot plate, the resulting solid was dissolved in a cyclohexane-toluene mixture (7:1 by volume). Analysis by means of high-pressure liquid chromatography (HPLC) with UV-Vis detection at 330 nm and using a Cosmosil Buckyprep analytical column (4.6×250 mm) with toluene for elution has shown the following composition: $C_{60}$: <1%, $C_{60}(C_9H_8)$: 3%, $C_{60}(C_9H_8)_2$: 43%, $C_{60}(C_9H_8)_3$: 49% and $C_{60}(C_9H_8)_4$: 4%. 1.5 g of $C_{60}(C_9H_8)_3$ were recovered after flash chromatographic separation under moderate pressure (10 psig) using silica gel 60 (230-400 mesh, Alfa Aesar) and a cyclohexane-toluene mixture (7:1 by volume) for elution. Separation of six $C_{60}(C_9H_8)_3$ isomers could be achieved by using smaller particle size silica gel (400-600 mesh) and cyclohexane-toluene mixture (9:1 by volume) for elution.

Procedure B:
5 g of $C_{60}$ was dissolved in 500 mL of indene, corresponding to an approximately 600-fold excess of indene. The mixture was stirred at 150° C. under inert gas (argon) for 18 h. After completion, the volume of the resulting solution was reduced under vacuum to approximately 200 mL and 800 mL of toluene were added. This mixture was stirred while 5 L of methanol were slowly added and precipitation occurred progressively. The resulting precipitate was filtered using 1 µm filter paper, rinsed with methanol and dried on a hot plate. The resulting solid was dissolved in a cyclohexane-toluene mixture (3:1 by volume). Analysis by means of high-pressure liquid chromatography (HPLC) with UV-Vis detection at 330 nm and using a Cosmosil Buckyprep analytical column (4.6×250 mm) with toluene for elution has shown the following composition: $C_{60}/C_{60}(C_9H_8)$: 1%, $C_{60}(C_9H_8)_2$: 5%, $C_{60}(C_9H_8)_3$: 48%, $C_{60}(C_9H_8)_4$: 38% and $C_{60}(C_9H_8)_5/C_{60}(C_9H_8)_6$: 7%. Most of the $C_{60}(C_9H_8)_3$ was recovered after flash chromatographic separation under moderate pressure (10 psig) using silica gel 60 (230-400 mesh, Alfa Aesar) and a cyclohexane-toluene mixture (3:1 by volume) for elution. Separation of six observed $C_{60}(C_9H_8)_3$ isomers was achieved by using smaller particle size silica gel (400-600 mesh) and cyclohexane-toluene mixture (9:1 by volume) for elution.

Example 4

Synthesis of $C_{60}(C_9H_8)_4$ 5 g of $C_{60}$ has been dissolved 500 in mL of indene, corresponding to an approximately 600-fold excess of indene, using a 1 L flat-bottom three neck flask. The mixture has been refluxed (181° C.) under inert gas (argon) for 18 h. After completion, the volume of the resulting solution was reduced under vacuum to approximately 200 mL and 800 mL of toluene were added. This mixture was stirred while 5 L of methanol were slowly added and precipitation occurred progressively. The resulting precipitate was filtered using 1 µm filter paper, rinsed with methanol and dried on a hot plate. The resulting solid was dissolved in a cyclohexane-toluene mixture (3:1 by volume). Analysis by means of high-pressure liquid chromatography (HPLC) at 330 nm with UV-Vis detection and using a Cosmosil Buckyprep analytical column (4.6×250 mm) with toluene for elution has shown the following composition: $C_{60}/C_{60}(C_9H_8)$: <1%, $C_{60}(C_9H_8)_2$: 3%, $C_{60}(C_9H_8)_3$: 27%, $C_{60}(C_9H_8)_4$: 50% and $C_{60}(C_9H_8)_5/C_{60}(C_9H_8)_6$: 19%. 900 mg of $C_{60}(C_9H_8)_4$ were recovered after flash chromatographic separation under moderate pressure (3 to 5 atm) using silica gel 60 (230-400 mesh, Alfa Aesar) and a cyclohexane-toluene mixture (3:1 by volume) for elution. Separation between $C_{60}(C_9H_8)_4$ isomers can be achieved by flash chromatography using smaller particle size silica gel (400-600 mesh) and cyclohexane-toluene mixture (9:1 by volume) for elution.

Example 5

Synthesis of $C_{60}(C_9H_8)_5$ and $C_{60}(C_9H_8)_6$ 5 g of $C_{60}$ has been dissolved in 500 mL of indene, corresponding to an approximately 600-fold excess of indene, using a 1 L flat-bottom three neck flask. The mixture has been refluxed (181° C.) under inert gas (argon) for 18 h. After completion, the volume of the resulting solution was reduced under vacuum to approximately 200 mL and 800 mL of toluene were added. This mixture was stirred while 5 L of methanol were slowly added and precipitation occurred progressively. The resulting precipitate was filtered using 1 μm filter paper, rinsed with methanol and dried on a hot plate. The resulting solid was dissolved in a cyclohexane-toluene mixture (3:1 by volume). Analysis by means of high-pressure liquid chromatography (HPLC) with UV-Vis detection at 330 nm and using a Cosmosil Buckyprep analytical column (4.6× 250 mm) with toluene for elution has shown the following composition: $C_{60}/C_{60}(C_9H_8)$: <1%, $C_{60}(C_9H_8)_2$: 3%, $C_{60}(C_9H_8)_3$: 27%, $C_{60}(C_9H_8)_4$: 50% and $C_{60}(C_9H_8)_5/C_{60}(C_9H_8)_6$: 19%. A mixture of $C_{60}(C_9H_8)_5$ and $C_{60}(C_9H_8)_6$ was recovered by flash chromatographic separation under moderate pressure (3 to 5 atm) using silica gel 60 (230-400 mesh, Alfa Aesar) and a cyclohexane-toluene mixture (3:1 by volume) for elution. Separation between $C_{60}(C_9H_8)_5$ and $C_{60}(C_9H_8)_6$ can be achieved by flash chromatography using smaller particle size silica gel (400-600 mesh) and cyclohexane-toluene mixture (9:1 by volume) for elution.

Example 6

Synthesis of 1,3-bis(3-indenyl)ethane Adducts with C60

To a round bottom flask was added 2.00 g (2.76 mmol) of C60 and 120 mL of o-dichlorobenzene. This was stirred under nitrogen until completely dissolved. To this solution was added 0.788 g (3.04 mmol) of commercially available 1,2-bis(3-indenyl)ethane and the resulting mixture was stirred and heated to reflux under nitrogen overnight and allowed to cool.

The mixture was purified chromatographically on a silica gel column. Analysis by cyclic voltammetry showed two sets of peaks spaced 150 mV apart, which is representative of a singular increase in the number of substituents (in this case, a mono-adduct to a bis-adduct). Thus, it was determined that the mixture contains the mono-[1,2-bis(3-indenyl)ethane]-C60 adduct and the bis-[1,2-bis(3-indenyl)ethane]-C60 adduct.

Example 7

Preparation of Polythiophene

Plexcore P3HT was prepared as described in Loewe, et al. *Adv. Mater.* 1999, 11, 250-253 using 2,5-dibromo-3-hexylthiophene in place of 2,5-dibromo-dodecylthiophene, and using 0.0028 eq. of Ni(dppp)Cl$_2$ instead of 0.01 eq. The molecular weight as measured by GPC using chloroform as eluant was 69,000, 1.35 PDI.

Example 8

Fabrication of Solar Cell Device Using C60 Indene Adducts

Photovoltaic devices were prepared comprising (i) patterned indium tin oxide (ITO, anode, 60 Ω/square) on glass substrate purchased from Thin Film Devices (located in Anaheim, Calif.), (ii) a thin layer of HIL (30 nm thick) comprising PEDOT/PSS (AI4083) purchased from HC Stark), (iii) a 100 nm active layer comprising Plexcore P3HT (prepared as described in Example 7 blended with the n-type, which is either methanofullerence [6,6]-phenyl C61-butyric acid methyl ester (PCBM) (purchased from Nano-C, located in Westwood, Mass.), $C_{60}$-Indene mono adduct, or $C_{60}$-indene bis-adduct, (the fullerene adducts prepared as described in above examples), and (iv) a Ca/Al bilayer cathode.

The patterned ITO glass substrates were cleaned with detergent, hot water and organic solvents (acetone and alcohol) in an ultrasonic bath and treated with ozone plasma immediately prior to device layer deposition. The HIL solution (Baytron AI 4083) was then spin coated on the patterned ITO glass substrate to achieve a thickness of 30 nm. The film was dried at 150° C. for 30 mins in a nitrogen atmosphere. The active layer was formulated to a 1.2:1 weight ratio P3HT:n-type blend in o-dichlorobenzene (formulation was made to 0.024% volume solids) and was then spun on the top of the HIL film with no damage to the HIL (verified by AFM).

The film was then annealed at 175° C. for 30 mins in a glove box. Next, a 5 nm Ca layer was thermally evaporated onto the active layer through a shadow mask, followed by deposition of a 150 nm Al layer. The devices were then encapsulated via a glass cover slip (blanket) encapsulation sealed with EPO-TEK OG112-4 UV curable glue. The encapsulated device was cured under UV irradiation (80 mW/cm$^2$) for 4 minutes and tested as follows.

The photovoltaic characteristics of devices under white light exposure (Air Mass 1.5 Global Filter) were measured using a system equipped with a Keithley 2400 source meter and an Oriel 300 W Solar Simulator based on a Xe lamp with output intensity of 100 mW/cm$^2$ (AM1.5G). The light intensity was set using an NREL-certified Si-KG5 silicon photodiode.

The Jsc, Voc and efficiency measured for each device are shown in the table below compared to a control device which was made as described above using PCBM as the n-type material. The data are further illustrated in FIG. 4.

TABLE

Figure 4:
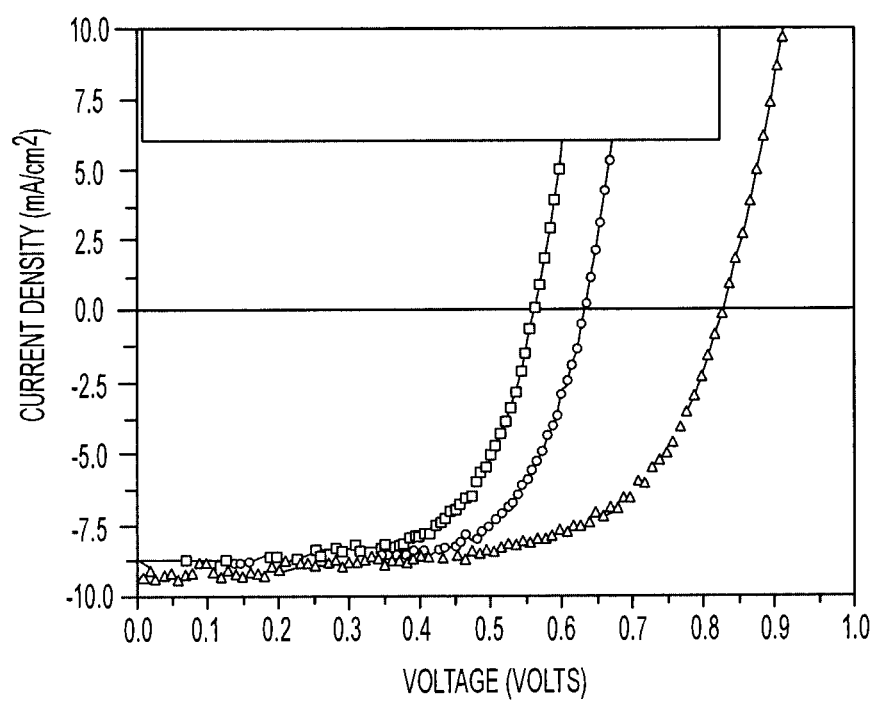
FIG. 4 provides photovoltaic data for devices comprising indene derivatives compared to a control.

| | FIG. 4 | Jsc (mA/cm$^2$) | Voc (V) | FF | Efficiency (%) |
|---|---|---|---|---|---|
| Control | --□-- | 8.92 | 0.56 | 0.66 | 3.3 |
| Mono-indene adduct | --○-- | 9.20 | 0.63 | 0.67 | 3.9 |
| Bis-indene adduct | --Δ-- | 9.48 | 0.82 | 0.63 | 4.9 |
| Bis-indene adduct | | 9.43 | 0.84 | 0.64 | 5.1 |

What is claimed is:
1. A method comprising:
reacting at least one fullerene with indene, at least one substituted indene, or a combination thereof wherein the volume amount of any solvent in addition to the indene, substituted indene, or combination thereof, is less than about 20% with respect to the volume amount of indene, substituted indene, or combination thereof, and wherein the fullerene is fully solubilized, wherein at the start of the reaction the molar amount of indene, substituted indene, or combination thereof with respect to the molar amount of fullerene is at least about 300, and wherein the reacting provides a mixture of indene-fullerene reaction products, wherein the primary reaction product is a bis-, tris-, or tetra-substituted indene fullerene derivative.

2. The method according to claim 1, wherein the method comprises reacting the at least one fullerene with indene.

3. A method comprising:

reacting at least one fullerene with indene, at least one substituted indene, or a combination thereof, wherein the fullerene is fully solubilized, and wherein the reacting is carried out with total absence of any solvent in addition to indene or substituted indene.

4. The method of claim 1, comprising reacting at least two fullerenes.

5. The method of claim 1, wherein the fullerene is a C60, a C70 fullerene, or a combination thereof.

6. The method of claim 1, wherein the fullerene comprises at least a C60 fullerene.

7. The method of claim 1, wherein the fullerene comprises at least a mixture of C60 and C70 fullerenes.

8. The method of claim 1, wherein the at least one fullerene comprises a mixture of at least a first fullerene and at least a second fullerene, and wherein after the reacting step the first fullerene and the second fullerene as reacted are subjected to a separation step.

9. The method of claim 1, wherein the reacting provides a mixture of indene-fullerene reaction products, wherein the primary reaction product is a bis-substituted indene fullerene derivative.

10. The method of claim 1, wherein the reacting provides a mixture of indene-fullerene reaction products, wherein the primary reaction product is a tris-substituted indene fullerene derivative.

11. The method of claim 1, wherein the reacting provides a mixture of indene-fullerene reaction products, wherein primary reaction product is a tetra-substituted indene fullerene derivative.

12. The method of claim 1, wherein the volume amount of any additional solvent is less than about 5% with respect to the volume amount of indene or substituted indene, or combination thereof.

13. A method according to claim 1, wherein the reaction is carried out for about 48 hours or less.

14. A method according to claim 1, wherein the reaction is carried out for about 24 hours or less.

15. A method according to claim 1, wherein at the start of the reaction the molar amount of indene, substituted indene, or combination thereof with respect to the molar amount of fullerene is at least about 500.

16. A method according to claim 1, wherein at the start of the reaction the molar amount of indene, substituted indene, or combination thereof with respect to the molar amount of fullerene is at least about 600.

17. A method according to claim 1, wherein reaction is carried out at a temperature of at least 150° C.

18. A method according to claim 1, wherein reaction is carried out at a temperature of at least 180° C.

19. A method according to claim 1, wherein the reaction is carried out at a pressure of at least 1.2 atmospheres.

20. A method according to claim 1, wherein the reaction is carried out at a pressure of at least 5 atmospheres.

21. A method according to claim 1, further comprising the step of isolating an indene-fullerene derivative comprising at least four indenes or substituted indenes per fullerene.

22. A method according to claim 1, further comprising the step of removing indene or substituted indene, and further comprising the step of precipitating an indene-derivatized fullerene.

23. A method according to claim 1, wherein after the reacting step, a reaction product is formed, and an extract is taken from this product to yield a residual reaction product, and the residual reaction product is subjected to further reaction.

24. A method according to claim 1, further comprising the step of removing indene or substituted indene, and further comprising the step of precipitating a indene derivatized fullerene, wherein the fullerene is a C60 or C70 fullerene, the reacting is carried out for 24 h or less, the reacting is carried out at a temperature of at least about 150° C., and at the start of the reaction the molar amount of indene, substituted indene, or combination thereof with respect to the molar amount of fullerene is at least about 500.

25. A method according to claim 1, further comprising the step of isolating an indene-fullerene derivative comprising at least two indenes or substituted indenes per fullerene.

26. A method according to claim 1, further comprising the step of isolating an indene-fullerene derivative comprising at least three indenes or substituted indenes per fullerene.

27. The method according to claim 1, wherein at the start of the reaction the reaction mixture consists of the fullerene and the indene, substituted indene or combination thereof.

28. The method according to claim 1, wherein at the start of the reaction the reaction mixture consists essentially of the fullerene and the indene, substituted indene or combination thereof.

* * * * *